United States Patent
Feng et al.

(10) Patent No.: US 9,240,406 B2
(45) Date of Patent: Jan. 19, 2016

(54) PRECISION TRENCH CAPACITOR

(71) Applicant: GLOBALFOUNDRIES INC., Grand Cayman (KY)

(72) Inventors: Kai D. Feng, Hopewell Junction, NY (US); Dan Moy, Bethel, CT (US); Chengwen Pei, Danbury, CT (US); Robert R. Robison, Colchester, VT (US); Pinping Sun, Fishkill, NY (US); Richard A. Wachnik, Mount Kisco, NY (US); Ping-Chuan Wang, Hopewell Junction, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/257,143

(22) Filed: Apr. 21, 2014

(65) Prior Publication Data

US 2015/0303191 A1    Oct. 22, 2015

(51) Int. Cl.
| | | |
|---|---|---|
| *H01L 27/07* | (2006.01) | |
| *H01L 29/66* | (2006.01) | |
| *H01L 29/94* | (2006.01) | |

(52) U.S. Cl.
CPC ...... *H01L 27/0733* (2013.01); *H01L 29/66181* (2013.01); *H01L 29/945* (2013.01)

(58) Field of Classification Search
None
See application file for complete search history.

(56) References Cited

U.S. PATENT DOCUMENTS

| | | |
|---|---|---|
| 7,989,922 B2 | 8/2011 | Mann et al. |
| 2004/0007918 A1* | 1/2004 | Clevenger ............. H01L 23/367 307/126 |
| 2007/0052013 A1* | 3/2007 | Kim ................... H01L 27/0207 257/330 |
| 2008/0157159 A1 | 7/2008 | Hook et al. |
| 2011/0019321 A1* | 1/2011 | Chen .................... G01R 31/028 361/87 |

FOREIGN PATENT DOCUMENTS

EP    0 747 956 A2 *    5/1996

OTHER PUBLICATIONS

Pei, C. et al., "A Novel, Low-Cost Deep Trench Decoupling Capacitor for High-Performance, Low-Power Bulk CMOS Applications" 9th International Conference on Solid-State and Integrated-Circuit Technology (Oct. 20-23, 2008) pp. 1146-1149.
Wang, W. et al., "Deep Trench Capacitor Drive of a 3.3 GHz Unreleased Si MEMS Resonator" IEEE International Electron Devices Meeting (IEDM) (Dec. 10-13, 2012) pp. 15.1.1-15.1.4.

* cited by examiner

*Primary Examiner* — Erik Kielin
(74) *Attorney, Agent, or Firm* — Scully, Scott, Murphy & Presser, P.C.

(57) ABSTRACT

A capacitor structure can include a parallel connection of a plurality of trench capacitors. First nodes of the plurality of trench capacitors are electrically tied to provide a first node of the capacitor structure. Second nodes of the plurality of trench capacitors are electrically tied together through at least one programmable electrical connection at a second node of the capacitor structure. Each programmable electrical connection can include at least one of a programmable electrical fuse and a field effect transistor, and can disconnect a corresponding trench capacitor temporarily or permanently. The total capacitance of the capacitor structure can be tuned by programming, temporarily or permanently, the at least one programmable electrical connection.

20 Claims, 25 Drawing Sheets

PRECISION TRENCH CAPACITOR

BACKGROUND

The present disclosure relates to a capacitor structure, and particularly to a precision trench capacitor structure with adjustable capacitance and a method of manufacturing the same.

Deep trench capacitors are used in a variety of semiconductor chips for high areal capacitance and low device leakage. Typically, a deep trench capacitor provides a capacitance in the range from 4 fF (femto-Farad) to 120 fF. A deep trench capacitor may be employed as a charge storage unit in a dynamic random access memory (DRAM), which may be provided as a stand-alone semiconductor chip, or may be embedded in a system-on-chip (SoC) semiconductor chip. A deep trench capacitor may also be employed in a variety of circuit applications such as a charge pump or a capacitive analog component in a radio-frequency (RF) circuit.

A plurality of deep trench capacitors can be connected in a parallel connection to provide a capacitor structure. The total capacitance of such a capacitor structure is the sum of all individual capacitance of the individual deep trench capacitors. Because the depth and the width of the trenches of the individual deep trench capacitors vary within each substrate and from substrate to substrate due to process variations, the total capacitance of a capacitor structure formed by a parallel connection of individual deep trench capacitors also varies within each substrate and from substrate to substrate.

Performance of a circuit including a capacitor structure containing a plurality of deep trench capacitors is adversely affected by the variations in the capacitance of the capacitor structure. This is especially so in a circuit requiring a high Q-factor such as a ring oscillator. Thus, there is a need to provide a capacitor structure having a high precision capacitance.

SUMMARY

A capacitor structure can include a parallel connection of a plurality of trench capacitors. First nodes of the plurality of trench capacitors are electrically tied to provide a first node of the capacitor structure. Second nodes of the plurality of trench capacitors are electrically tied together through at least one programmable electrical connection at a second node of the capacitor structure. Each programmable electrical connection can include at least one of a programmable electrical fuse and a field effect transistor, and can disconnect a corresponding trench capacitor temporarily or permanently. The total capacitance of the capacitor structure can be tuned by programming, temporarily or permanently, the at least one programmable electrical connection.

According to an aspect of the present disclosure, a capacitor structure includes a set of serially connected devices containing an inner electrode of a trench capacitor located in a semiconductor substrate and a programmable electrical switching device located on the semiconductor substrate. The programmable electrical switching device is electrically shorted to a first node of the capacitor structure. The capacitor structure further includes at least another trench capacitor located in the semiconductor substrate, wherein an inner electrode of each of the at least another trench capacitor is electrically shorted to the first node of the capacitor structure. An outer electrode of the trench capacitor and an outer electrode of each of the at least another trench capacitor are electrically shorted to a second node of the capacitor structure.

According to another aspect of the present disclosure, a capacitor structure includes a set of serially connected devices including an electrically programmable fuse structure located on a semiconductor substrate and a field effect transistor located on the semiconductor substrate, and a trench capacitor located in the semiconductor substrate. An inner electrode of the trench capacitor is electrically shorted to a node in the series connection.

According to another aspect of the present disclosure, a method of forming a capacitor structure is provided. A first trench capacitor and a plurality of second trench capacitors are formed within a semiconductor substrate. A programmable electrical switching device is formed on the semiconductor substrate. The programmable electrical switching device includes at least one of a field effect transistor and an electrically programmable fuse structure. An inner electrode of the first trench capacitor is electrically shorted to one end node of the programmable electrical switching device. Metal interconnect structures are formed on the substrate. Another end of the programmable electrical switching device is electrically shorted to inner electrodes of the plurality of second trench capacitors through a subset of the metal interconnect structures to provide a first node of a capacitor structure.

DETAILED DESCRIPTION

Figure 1:
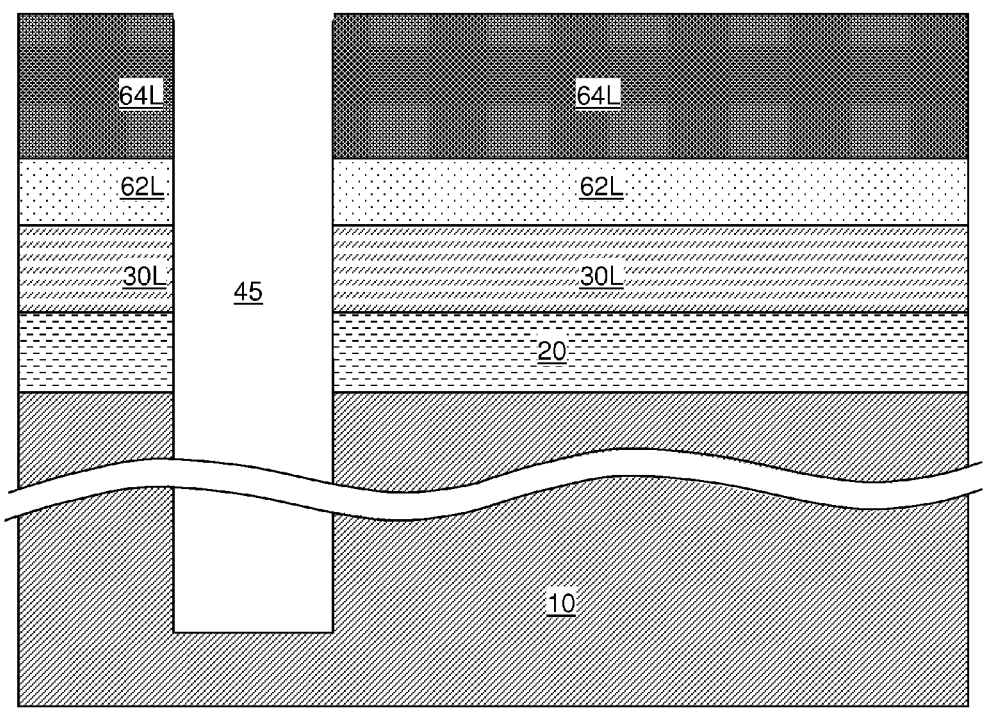
FIG. 1 is a vertical cross-sectional view of a first exemplary semiconductor structure after formation of deep trenches according to a first embodiment of the present disclosure.

As stated above, the present disclosure relates to a precision trench capacitor structure with adjustable capacitance and a method of manufacturing the same. These aspects of the present disclosure are now described in detail with accompanying figures. It is noted that like reference numerals refer to like elements across different embodiments. The drawings are not necessarily drawn to scale. As used herein, ordinals such as "first" and "second" are employed merely to distinguish similar elements, and different ordinals may be employed to designate a same element in the specification and/or claims.

Figure 1A:
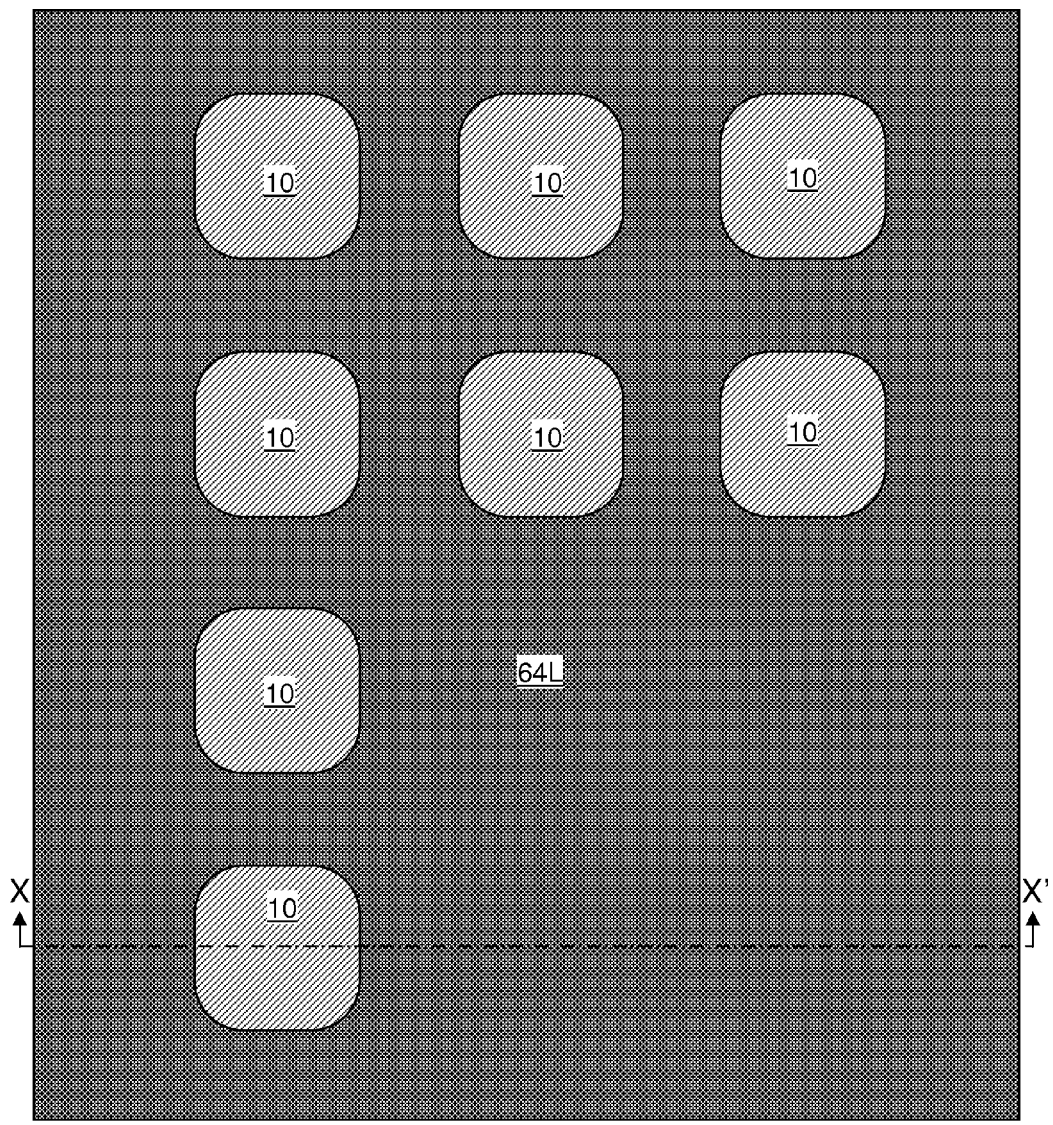
FIG. 1A is a top-down view of the first exemplary semiconductor structure of FIG. 1. The vertical plane X-X' is the plane of the vertical cross-sectional view of FIG. 1.

Referring to FIGS. 1 and 1A, a first exemplary semiconductor structure according to a first embodiment of the present disclosure includes a semiconductor-on-insulator (SOI) substrate. The SOI substrate includes a stack, from bottom to top, of a bottom semiconductor layer 10, a buried insulator layer 20, and a top semiconductor layer 30L.

The bottom semiconductor layer 10 includes a semiconductor material. The buried insulator layer 20 includes a dielectric material such as silicon oxide, silicon nitride, a dielectric metal oxide, or a combination thereof. The top semiconductor layer 30L includes a semiconductor material, which can be the same as, or different from, the semiconductor material of the bottom semiconductor layer 10.

Each of the bottom semiconductor layer 10 and the top semiconductor layer 30L includes a semiconductor material independently selected from elemental semiconductor materials (e.g., silicon, germanium, carbon, or alloys thereof), III-V semiconductor materials, or II-VI semiconductor materials. Each semiconductor material for the bottom semiconductor layer 10 and the top semiconductor layer 30L can be independently single crystalline, polycrystalline, or amorphous. In one embodiment, the bottom semiconductor layer 10 and the top semiconductor layer 30L are single crystalline. In one embodiment, the bottom semiconductor layer 10 and the top semiconductor layer 30L include single crystalline silicon.

In one embodiment, the bottom semiconductor layer 10 can be doped with dopants of a first conductivity type. The first conductivity type can be p-type or n-type.

In one embodiment, the thickness of the top semiconductor layer 30L can be from 5 nm to 300 nm, the thickness of the buried insulator layer 20 can be from 20 nm to 1,000 nm, and the thickness of the bottom semiconductor layer 10 can be from 50 microns to 2 mm, although lesser and greater thicknesses can also be employed for each of these layers (10, 20, 30L).

At least one dielectric mask layer can be deposited on the SOI substrate (10, 20, 30L), for example, by chemical vapor deposition (CVD) or atomic layer deposition (ALD). The at least one dielectric mask layer can include one or more layers that can be employed as an etch mask for forming deep trenches 45 in the SOI substrate (10, 20, 30L). As used herein, a "deep trench" refers to a trench that extends from a topmost surface of a semiconductor-on-insulator (SOI) substrate through a top semiconductor layer and a buried insulator layer and partly into an underlying semiconductor layer.

In one embodiment, each of the at least one dielectric mask layer can include a dielectric material such as silicon nitride, a dielectric metal nitride, a doped silicon undoped silicon oxide, or a dielectric metal oxide. The total thickness of the at least one dielectric mask layer can be from 100 nm to 2,000 nm, although lesser and greater thicknesses can also be employed.

In one embodiment, the at least one dielectric mask layer includes a stack of a lower dielectric mask layer 62L and an upper dielectric mask layer 64L. The lower dielectric mask layer 62L includes a first dielectric material, and the upper dielectric mask layer 64L includes a second dielectric material that is different from the first dielectric material. In one embodiment, the lower dielectric mask layer 62L can include silicon nitride or a vertical stack, from bottom to top, of a silicon oxide layer and a silicon nitride layer. The upper dielectric mask layer 64L can include borosilicate glass. In one embodiment, the thickness of the lower dielectric mask layer 62L can be from 10 nm to 200 nm, and the thickness of the upper dielectric mask layer 64L can be from 200 nm to 800 nm, although lesser and greater thicknesses can also be employed for each of the lower dielectric mask layer 62L and the upper dielectric mask layer 64L.

A photoresist layer (not shown) can be applied over the at least one dielectric mask layer (62L, 64L) and can be lithographically patterned to form openings having areas of deep trenches 45 to be subsequently formed. The pattern in the photoresist layer can be transferred into the at least one dielectric mask layer (62L, 64L). Subsequently, the pattern in the at least one dielectric mask layer (62L, 64L) can be transferred through the top semiconductor layer 30L, the buried insulator layer 20, and an upper portion of the bottom semiconductor layer 10 by an anisotropic etch that employs the at least one dielectric mask layer (62L, 64L) as an etch mask. Deep trenches 45 can be formed for each opening in the at least one dielectric mask layer (62L, 64L). The photoresist can be removed by ashing, or can be consumed during the etch process that forms the deep trenches 45.

The deep trenches 45 can be formed in an array environment and a non-array environment. As used herein, an array environment refers to an environment in which elements are repeated in a two-dimensional array. At least one deep trench 45 is formed in a non-array environment, and a plurality of trenches 45 is formed in an array environment. Each deep trench 45 that is not in an array environment is herein referred to as a discrete deep trench.

The sidewalls of the deep trenches 45 can be substantially vertically coincident among the various layers (64L, 62L, 30L, 20, 10) through which the deep trenches 45 extend. As used herein, sidewalls of multiple elements are "vertically coincident" if the sidewalls of the multiple elements overlap in a top-down view such as FIG. 1A. As used herein, sidewalls of multiple elements are "substantially vertically coincident" if the lateral offset of the sidewalls of the multiple elements from a perfectly vertical surface is within 5 nm. The depth of the deep trenches 45, as measured from the plane of the topmost surface of the SOI substrate (10, 20, 30L) to the bottom surface of the deep trenches 45, can be from 500 nm to 10 microns, although lesser and greater depths can also be employed. The lateral dimensions of each deep trench 45 can be limited by the lithographic capabilities, i.e., the ability of a lithographic tool to print the image of an opening on the photoresist layer. In one embodiment, the "width," i.e., a sidewall to sidewall distance, of each deep trench 45 can be from 32 nm to 150 nm, although lesser dimensions can be employed with availability of lithographic tools capable of printing smaller dimensions in the future.

Figure 2:
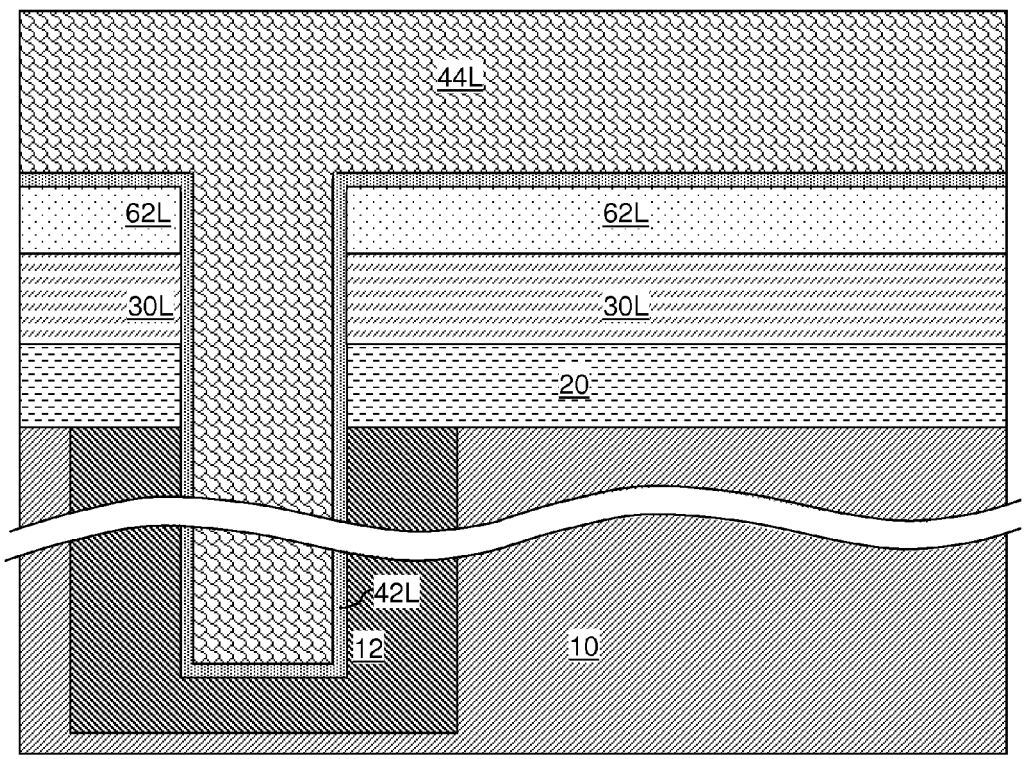
FIG. 2 is a vertical cross-sectional view of the first exemplary semiconductor structure after formation of a node dielectric layer and an inner electrode layer in the deep trenches according to the first embodiment of the present disclosure.

Referring to FIG. 2, the upper dielectric mask layer 64L can be removed selective to the lower dielectric mask layer 62L. A buried plate 12 can be formed by doping a portion of the bottom semiconductor layer 12 in proximity of sidewalls of the bottom semiconductor layer 10 within each deep trench 45. Dopants can be introduced, for example, by outdiffusion from a dopant-including disposable material (such as a doped silicate glass) or by ion implantation as known in the art. Further, any other method of forming a buried plate 12 in the bottom semiconductor layer 10 of an SOI substrate (10, 20, 30L) can be employed in lieu of outdiffusion from a dopant-including disposable material or ion implantation.

In one embodiment, the buried plate 12 can be doped with dopants of a second conductivity type which is the opposite of the first conductivity type. For example, the first conductivity type can be p-type and the second conductivity type can be n-type, or vice versa. A p-n junction is formed between the remaining portion of the bottom semiconductor layer 10 and the buried plate 12. The dopant concentration in the buried plate 12 can be, for example, from $1.0 \times 10^{18}/cm^3$ to $2.0 \times 10^{21}/cm^3$, and typically from $5.0 \times 10^{18}/cm^3$ to $5.0 \times 10^{19}/cm^3$, although lesser and greater dopant concentrations can also be employed.

A node dielectric layer 42L can be deposited conformally on all physically exposed sidewalls in the deep trenches and on the top surface of the lower dielectric mask layer 62L. The node dielectric layer 42L can include any dielectric material that can be employed as a node dielectric material in a capacitor known in the art. For example, the node dielectric layer 42L can include at least one of silicon nitride and a dielectric metal oxide material such as high dielectric constant (high-k) gate dielectric material as known in the art.

An inner electrode layer 44L can be deposited to completely fill the deep trenches 45. The inner electrode layer 44L includes a conductive material, which can be a metallic material or a doped semiconductor material. The metallic material can be an elemental metal such as W, Ti, Ta, Cu, or Al, or an alloy of at least two elemental metals, or a conductive metallic nitride of at least one metal, or a conductive metallic oxide of at least one metal. The doped semiconductor material can be a doped elemental semiconductor material, a doped compound semiconductor material, or an alloy thereof. The inner electrode layer 44L can be deposited by physical vapor deposition (PVD), chemical vapor deposition (CVD), electroplating, electroless plating, or a combination thereof. The inner electrode layer 44L is deposited to a thickness that is sufficient to completely fill the deep trenches 45.

Figure 3:
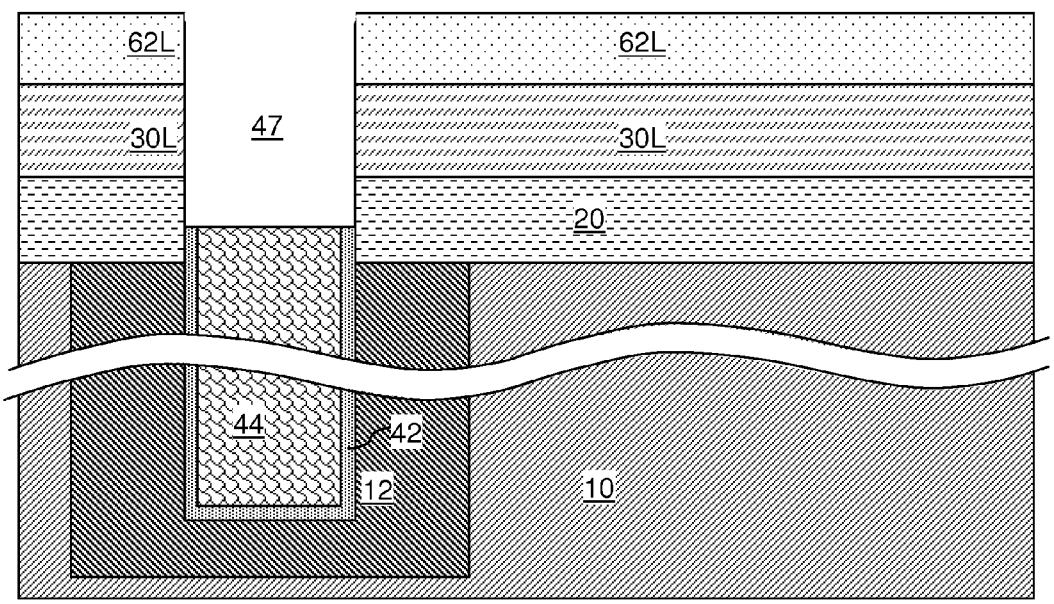
FIG. 3 is a vertical cross-sectional view of the first exemplary semiconductor structure after recessing the inner electrode layer and removal of exposed portions of the node dielectric layer according to the first embodiment of the present disclosure.

Referring to FIG. 3, the inner electrode layer 44L can be vertically recessed to a level between the top surface of the buried insulator layer 20 and the bottom surface of the buried insulator layer 20 by a recess etch. The recess etch of the conductive material layer can employ an anisotropic etch such as a reactive ion etch, an isotropic etch such as a wet etch, or a combination thereof. The recess etch can be selective to the material of the node dielectric layer 42L.

An inner electrode 44 including the conductive material of the inner electrode layer 44L is formed in each deep trench 45. The topmost surface of each inner electrode 44 can be substantially planar, and can be located between the level of the top surface of the buried insulator layer 20 and the level of the bottom surface of the buried insulator layer 20. As used herein, a surface is "substantially planar" if the planarity of the surface is limited by microscopic variations in surface height that accompanies semiconductor processing steps known in the art. A cavity 47 is formed above the inner electrode 44.

The physically exposed portions of the node dielectric layer 42L can be patterned by an etch, which can be a wet etch. For example, if the node dielectric layer 42L includes silicon nitride, the physically exposed portions of the node dielectric layer 42L can be removed by a wet etch employing hot phosphoric acid. The remaining portion of the node dielectric layer 42L within each deep trench 45 constitutes a node dielectric 42. Each set of a portion of the buried plate 12 laterally surrounding a deep trench, a node dielectric 42 on the sidewalls of the deep trench, and the inner electrode 44 therein constitute a trench capacitor (12, 42, 44). The buried plate 12, which can be a single contiguous structure, is an outer node of the trench capacitors, each node dielectric 42 is a dielectric separating an outer electrode from an inner electrode, and each inner electrode 44 is the inner electrode of a trench capacitor. Each trench capacitor is embedded within the SOI substrate (10, 12, 20, 30L). The buried insulator layer 20 overlies the buried plate 12 (i.e., the outer electrode). Each trench capacitor (12, 42, 44) in an array environment is herein referred to as an array trench capacitor, and each trench capacitor (12, 42, 44) that is not in an array environment is herein referred to as a discrete trench capacitor.

Figure 4:
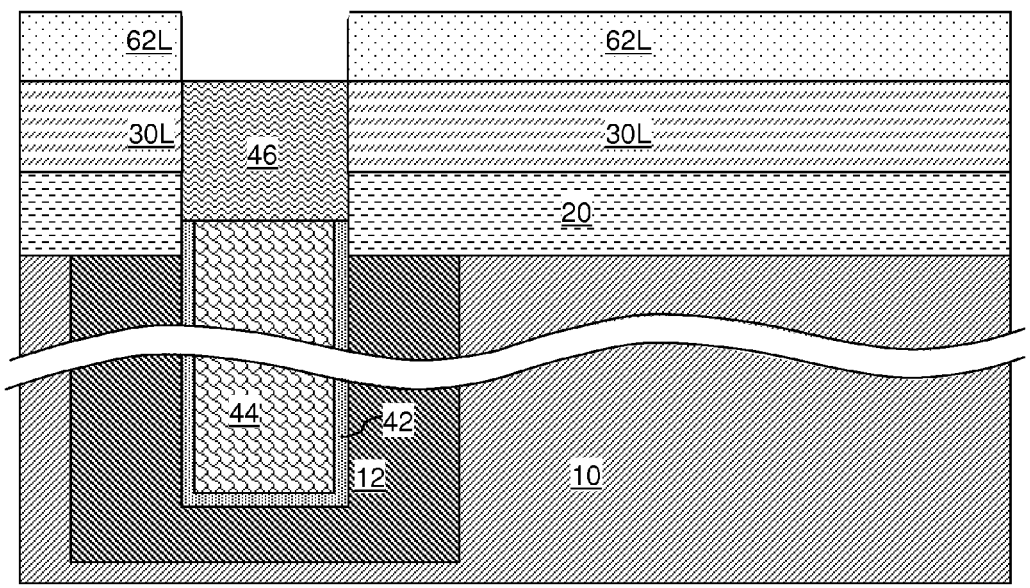
FIG. 4 is a vertical cross-sectional of the first exemplary semiconductor structure after formation of a conductive strap structure according to the first embodiment of the present disclosure.

Referring to FIG. 4, a conductive strap structure 46 can be formed directly on a top surface of each inner electrode 46, for example, by depositing a conductive material within the cavity 47 and above the lower dielectric mask layer 62L, and subsequently recessing the conductive material. Specifically, the conductive material can be a metallic material or a doped semiconductor material. The metallic material can be an elemental metal such as W, Ti, Ta, Cu, or Al, or an alloy of at least two elemental metals, or a conductive metallic nitride of at least one metal, or a conductive metallic oxide of at least one metal. The doped semiconductor material can be a doped elemental semiconductor material, a doped compound semiconductor material, or an alloy thereof. The conductive material can be deposited by physical vapor deposition (PVD), chemical vapor deposition (CVD), electroplating, electroless plating, or a combination thereof. The conductive material is deposited to a thickness that is sufficient to completely fill each cavity 47 as illustrated in FIG. 3.

The conductive material can be planarized, for example, by chemical mechanical planarization (CMP) employing the upper dielectric mask layer 54L as a stopping layer. Subsequently, the conductive material is recessed to a depth between the top surface of the lower dielectric mask layer 62L and the bottom surface of the top semiconductor layer 30L to form the conductive strap structure 46. In one embodiment, the top surface of each conductive strap structure 46 can be located at, or above, the top surface of the top semiconductor layer 30L. The conductive strap structure 46 can include the same material as, or a material different from, the inner electrode 44. A cavity 47 is formed above each conductive strap structure 46. Each conductive strap structure 46 is in contact with, and overlies, an inner electrode 44.

Figure 5:
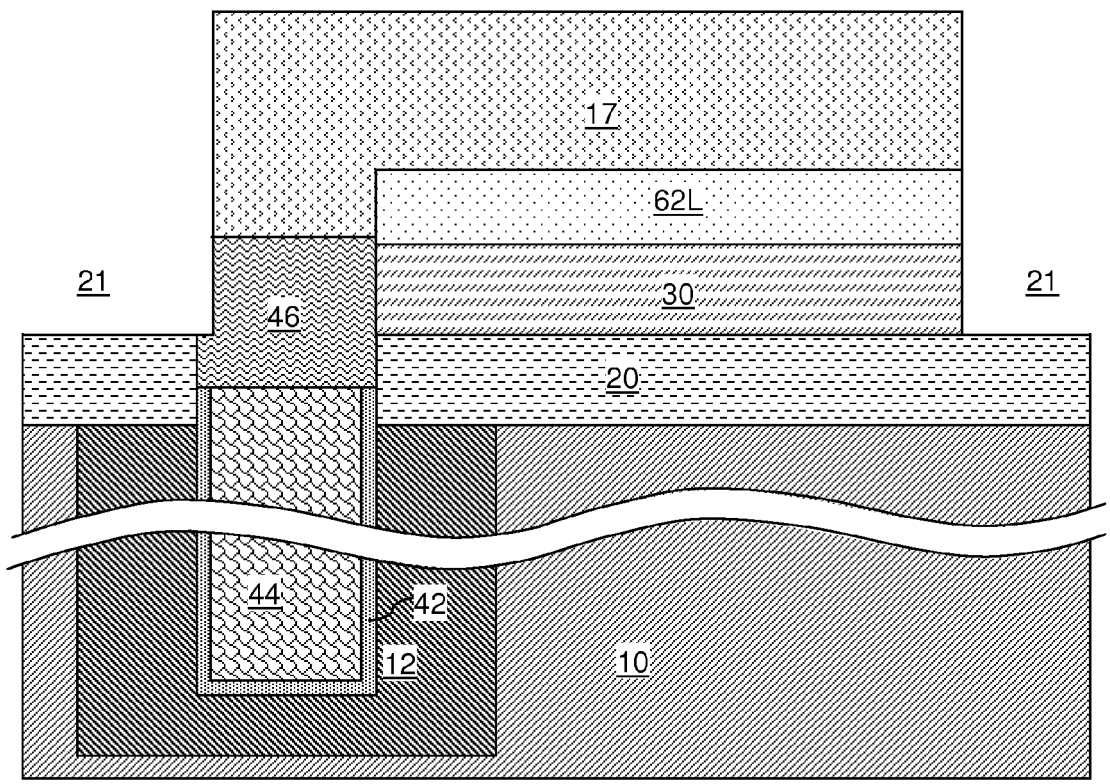
FIG. 5 is a vertical cross-sectional view of the first exemplary semiconductor structure after formation of shallow trenches according to the first embodiment of the present disclosure.

Referring to FIG. 5, a photoresist layer 17 is applied over the lower dielectric mask layer 62L, and is lithographically patterned to cover a portion of each conductive strap structure 46 that overlies a discrete trench capacitor and an adjoining portion of the top semiconductor layer 30L. The pattern in the photoresist layer 17 is transferred through the lower dielectric mask layer 62L, the top semiconductor layer 30L, and the conductive strap structures 46 by an anisotropic etch that employs the photoresist layer 17 as an etch mask. Peripheral portions of the conductive strap structures 46 can be removed by the anisotropic etch. The buried insulator layer 20 can be employed as a stopping layer for the anisotropic etch.

A contiguous shallow trench 21 extending from the top surfaces of the remaining portions of the top semiconductor layer 30L to the top surface of the physically exposed portions of the buried insulator layer 20 can be formed by the anisotropic etch. Each remaining portion of the top semiconductor layer 30L is herein referred to as a semiconductor material portion 30. Each remaining portion of the top semiconductor layer 30L that adjoins a conductive strap structure 46 overlying a discrete trench capacitor is herein referred to as a semiconductor material portion 30. At least one semiconductor material portion 30 is formed from the remaining portions of the top semiconductor layer 30L. The photoresist layer 17 is subsequently removed, for example, by ashing.

Figure 6:
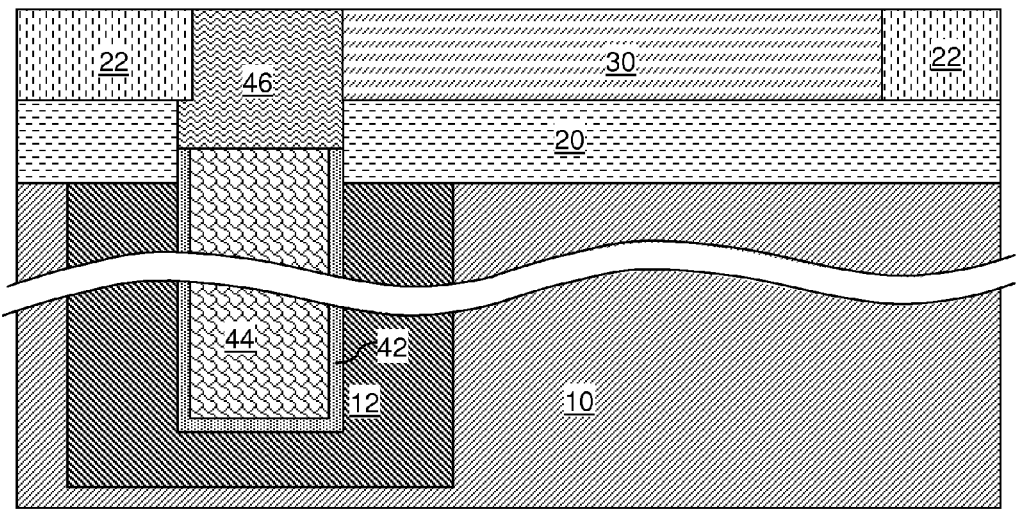
FIG. 6 is a vertical cross-sectional view of the first exemplary semiconductor structure after formation of a shallow trench isolation structure according to the first embodiment of the present disclosure.
Figure 6B:
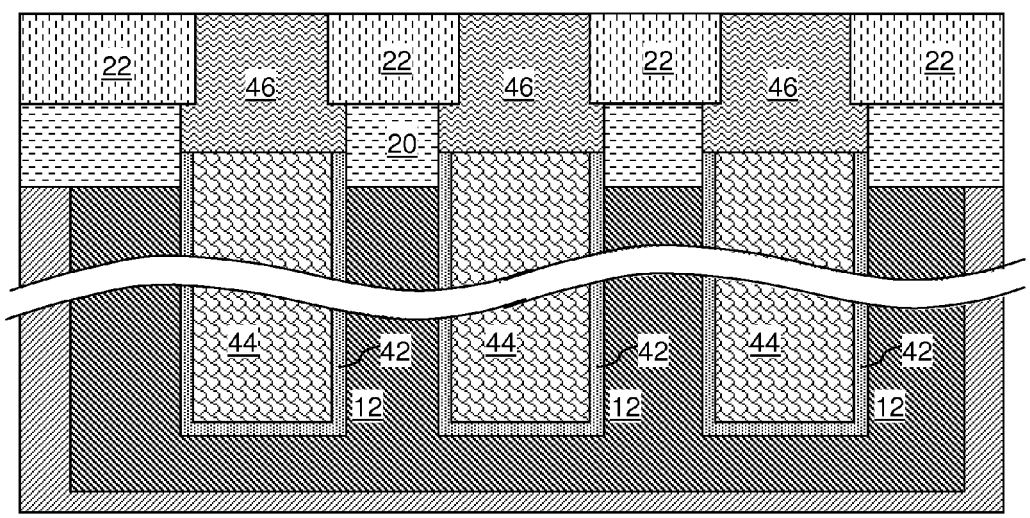
FIG. 6B is a vertical cross-sectional view of the first exemplary semiconductor structure of FIG. 6A along the vertical plane B-B'.
Figure 6A:
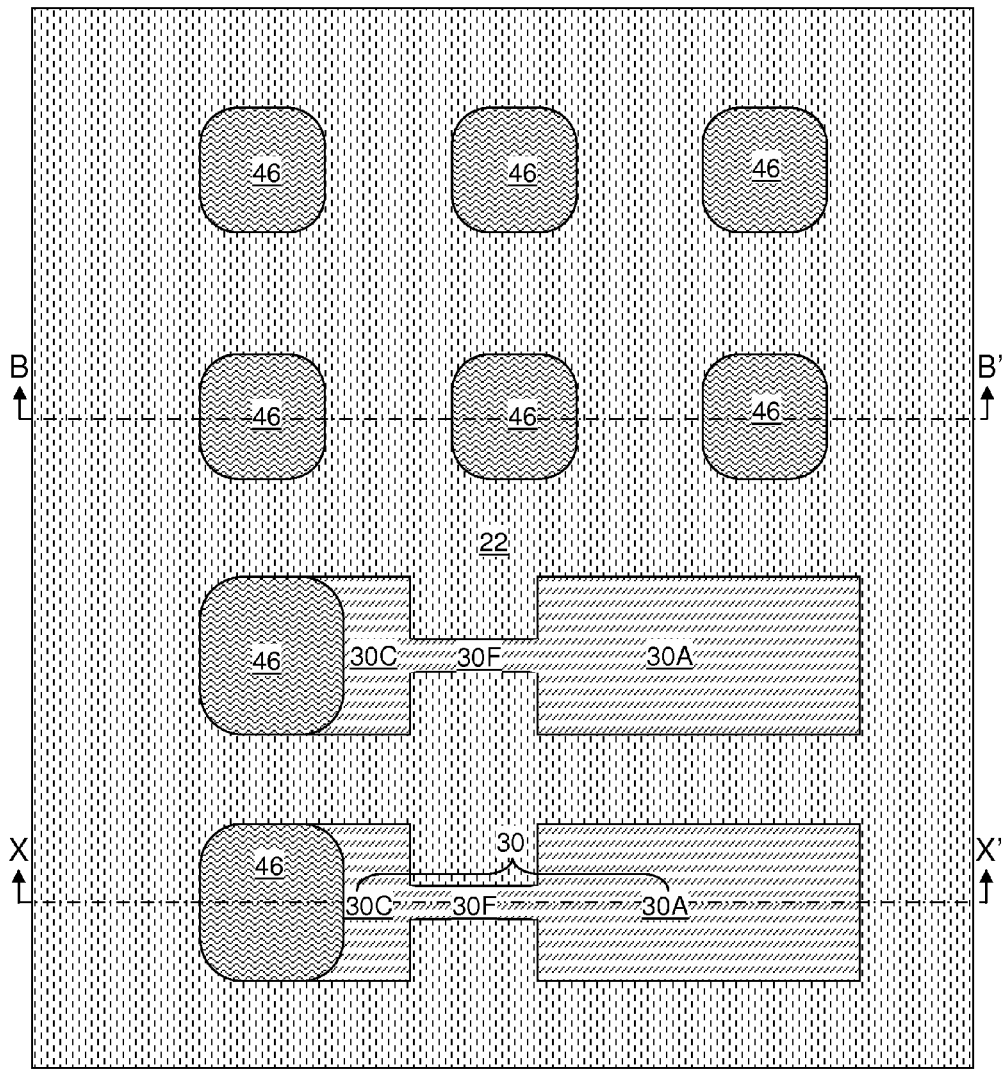
FIG. 6A is a top-down view of the first exemplary semiconductor structure of FIG. 6. The vertical plane X-X' is the plane of the vertical cross-sectional view of FIG. 6. The vertical plane B-B' is the plane of the vertical cross-sectional view of FIG. 6B.

Referring to FIGS. 6, 6A, and 6B, a dielectric material is deposited to fill the contiguous shallow trench 21. The dielectric material can be, for example, silicon oxide. The dielectric material is planarized, for example, by chemical mechanical planarization. The lower dielectric mask layer 62 can be employed as a stopping layer during the planarization process. Subsequently, the remaining deposited dielectric material is vertically recessed to form a shallow trench isolation structure 22. The lower dielectric mask layer 62L can be subsequently removed, for example, by a wet etch that is selective to the materials of the at least one semiconductor material portion 30 and the conductive strap structures 46. In one embodiment, the wet etch can be selective to the dielectric material of the shallow trench isolation structure 22.

Each semiconductor material portion 30 is a contiguous remaining portion of the top semiconductor layer 30L, and can include a region for forming a field effect transistor and another region for forming an electrically programmable fuse. In one embodiment, each semiconductor material portion 30 can include a rectangular semiconductor portion 30A for forming a field effect transistor and a rectangular pad of an electrically programmable fuse, a semiconductor fuselink portion 30F having a rectangular shaped and a lesser width than the rectangular semiconductor portion 30A, and a pad semiconductor portion 30C that adjoins a conductive strap structure 46. Each semiconductor fuselink portion 30F laterally extends with a same width, which can be the minimum width that is printable with a single exposure photolithography, or a "critical dimension." The rectangular semiconductor portions 30A and the pad semiconductor portions 30C have greater widths than the semiconductor fuselink portions 30F. Each pad semiconductor portion laterally contacts a conductive strap structure 46.

Figure 7:
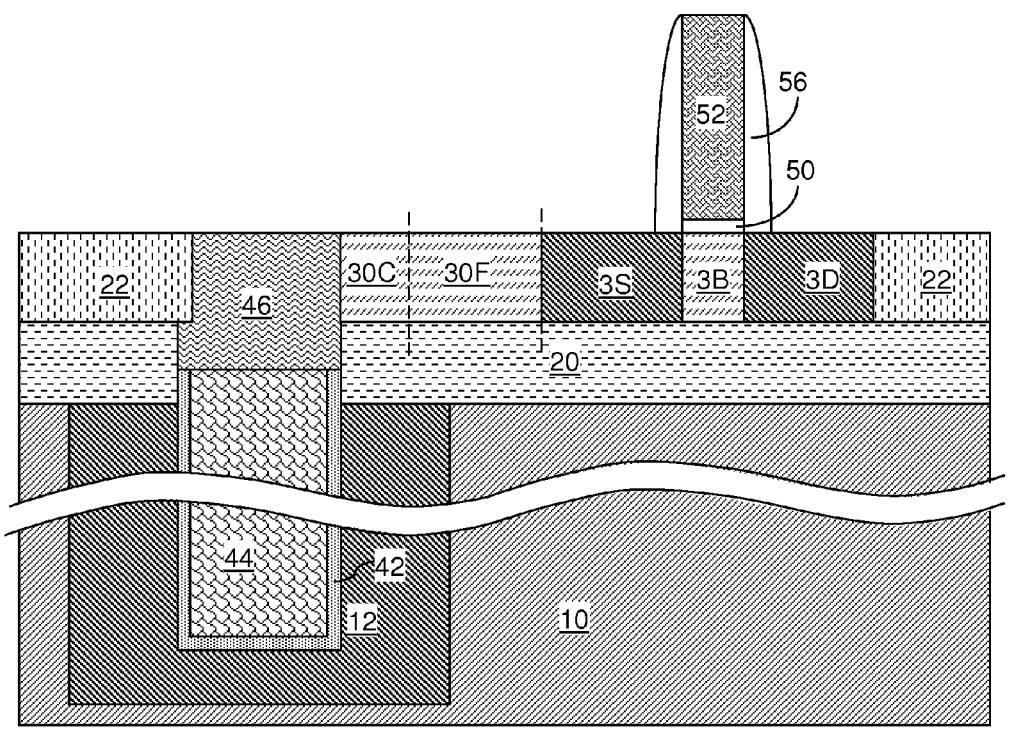
FIG. 7 is a vertical cross-sectional view of the first exemplary semiconductor structure after formation of access field effect transistors according to the first embodiment of the present disclosure.
Figure 7A:
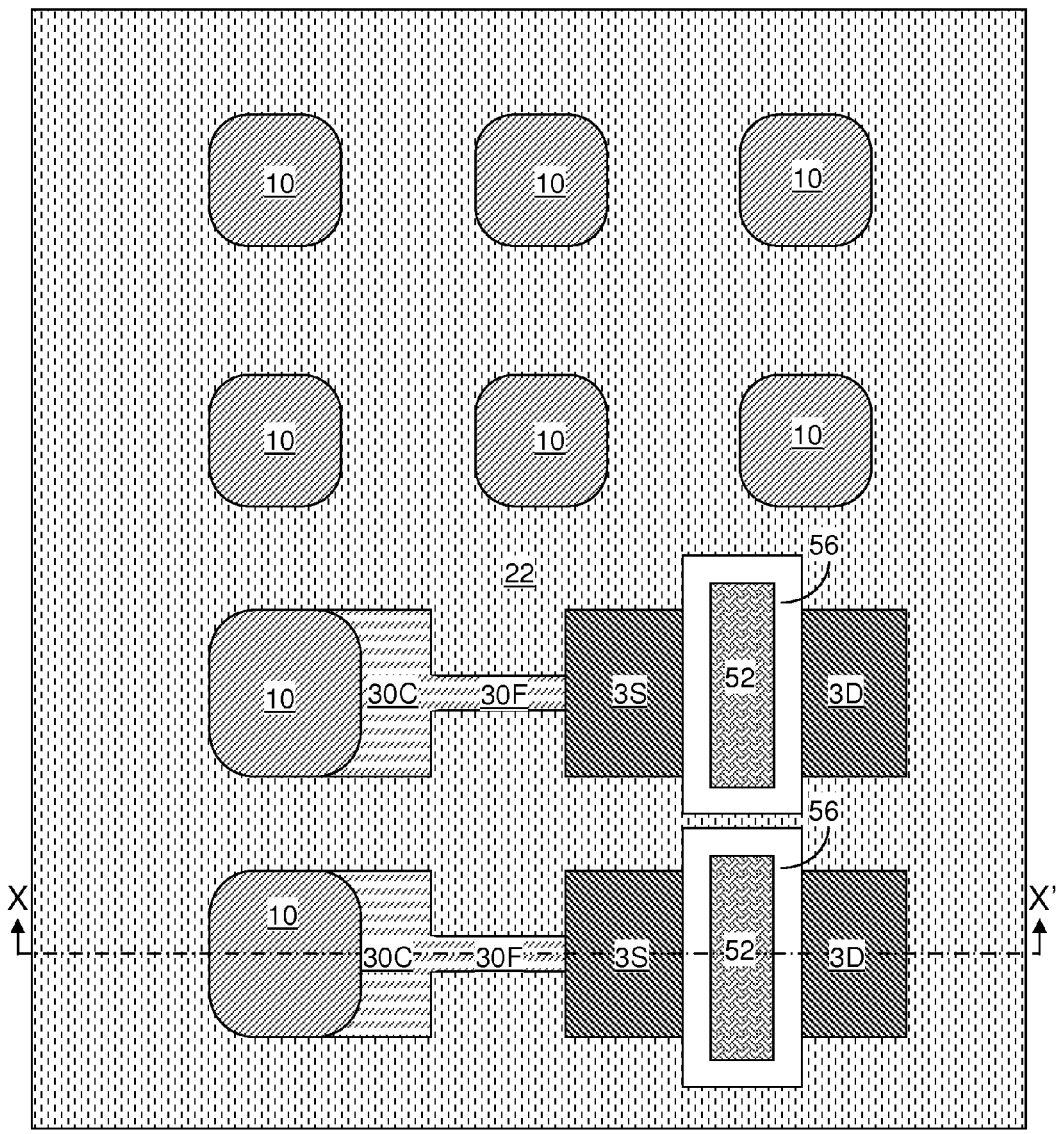
FIG. 7A is a top-down view of the first exemplary semiconductor structure of FIG. 7.

Referring to FIGS. 7 and 7A, a field effect transistor can be formed on each semiconductor material portion 30. Specifically, a gate stack structure (50, 52) is formed over, and across, each rectangular semiconductor portion 30A. A gate spacer 56 can be formed around each gate stack structure (50, 52). A source region 3S and a drain region 3D can be formed by doping portions of each rectangular semiconductor portion 30A employing the gate stack structure (50, 52) as an implantation mask. A remaining portion of each rectangular semiconductor portion 30A underlying the gate stack structure (50, 52) constitutes a body region 3B. Thus, each semiconductor material portion (3S, 3D, 3B, 30F, 30C) can include a source region 3S, a drain region 3D, a body region 3B, a semiconductor fuselink portion 30F, and a pad semiconductor portion 30C. It is understood that the locations of the source region and the drain region can be reversed in a field effect transistor by changing the polarity of applied voltages. Embodiments in which the source region and the drain region are reversed in each field effect transistor are expressly contemplated herein.

Figure 8:
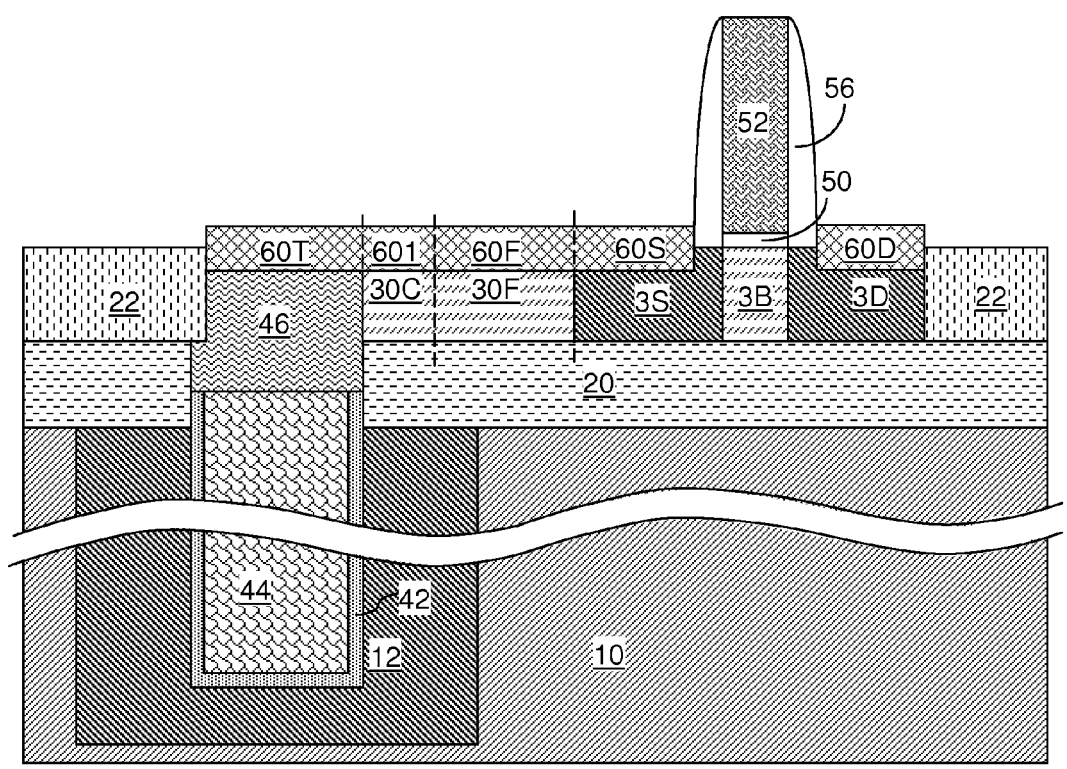
FIG. 8 is a vertical cross-sectional view of the first exemplary semiconductor structure after formation of metal semiconductor alloy regions according to the first embodiment of the present disclosure.
Figure 8A:
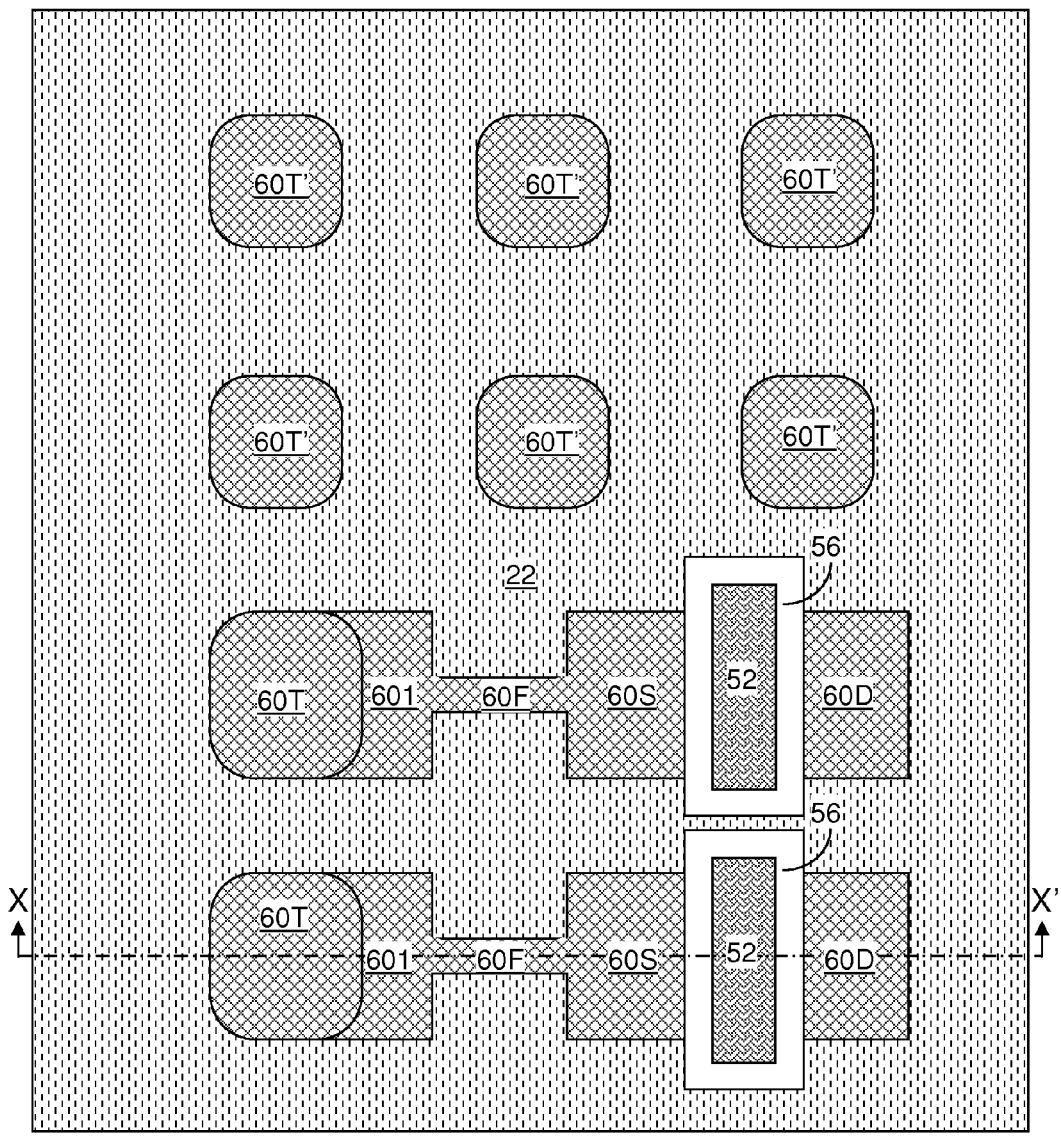
FIG. 8A is a top-down view of the first exemplary semiconductor structure of FIG. 8.

Referring to FIGS. 8 and 8A, various metal semiconductor alloy regions (60T, 60I, 60F, 60S, 60D) can be formed on physically exposed semiconductor surfaces by depositing a metallic material layer, inducing formation of a metal semiconductor alloy by an anneal, and by removing unreacted portions of the metallic material layer selective to the metal semiconductor alloy. The metal semiconductor alloy regions (60T, 60I, 60F, 60S, 60D) can include at least one contiguous metal semiconductor alloy structure (60T, 60I, 60F, 60S). Each contiguous metal semiconductor alloy structure (60T, 60I, 60F, 60S) can include a trench top metal semiconductor alloy portion 60T overlying an inner electrode 44 of a trench capacitor (12, 42, 44), a pad metal semiconductor alloy portion 60I contacting a top surface of a pad semiconductor portion 30C, a metal semiconductor alloy link portion 60F formed between the trench top metal semiconductor alloy portion 60T and a source-side metal semiconductor alloy portion 60S, and the source-side metal semiconductor alloy portion 60S contacting, and overlying, a source region 3S of a field effect transistor. At least one portion of the contiguous metal semiconductor alloy structure (60T, 60I, 60F, 60S) can be a component of a programmable electrical switching device. A drain-side metal semiconductor alloy portion 60D can be formed over each drain region 3D. Additional trench top metal semiconductor alloy portions 60T can be formed on the conductive cap structures 46 overlying inner electrodes 44 of trench capacitors (12, 42, 44) in the array environment.

Each combination of a contiguous metal semiconductor alloy structure (60T, 60I, 60F, 60S) and underlying semiconductor material portions that include the source region 3S, the semiconductor fuselink portion 30F, and the pad semiconductor portion 30C constitutes an electrically programmable fuse ("e-Fuse") structure. As used herein, an electrically programmable fuse refers to a semiconductor device structure including a metal semiconductor alloy that can be electromigrated to provide an electrically open state if programmed employing sufficient electrical current that passes through the metal semiconductor alloy.

Each series connection of a field effect transistor and an electrically programmable fuse structure constitutes a programmable electrical switching device. The programmable electrical switching device can be in an electrically conducting state when the field effect transistor is turned on without applying a voltage bias across the source region 3S and the drain region 3D and the electrically programmable fuse structure is not programmed (electromigrated), or can be in an electrically disconnected state when the field effect transistor is turned off and/or the electrically programmable fuse structure is in a programmed state. The programming of each programmable electrically programmable fuse structure can be performed by turning on the field effect transistor (which functions as a programming transistor) while applying a voltage bias across the source region 3S and the drain region 3D. An inner electrode 44 of a trench capacitor (12, 42, 44) is electrically shorted to one end node of the programmable electrical switching device.

Figure 9:
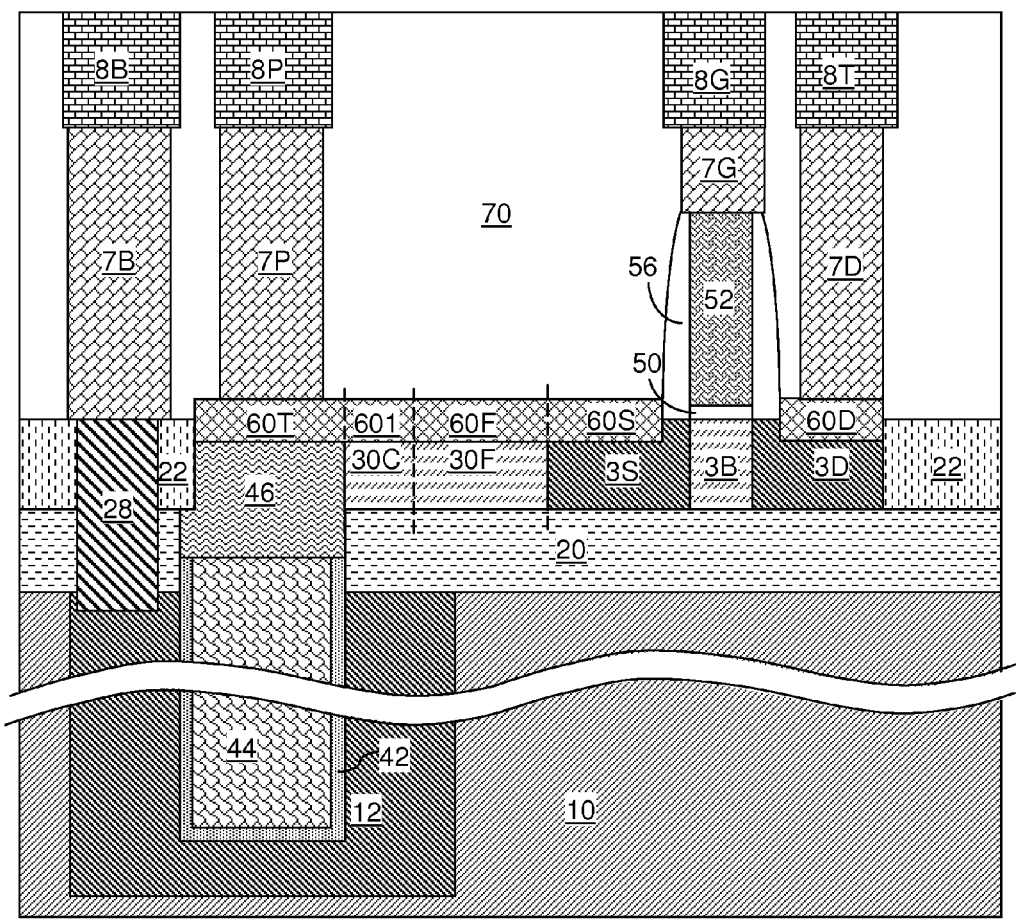
FIG. 9 is a vertical cross-sectional view of the first exemplary semiconductor structure after formation of a contact level dielectric layer and metal interconnect structures according to the first embodiment of the present disclosure.
Figure 9A:
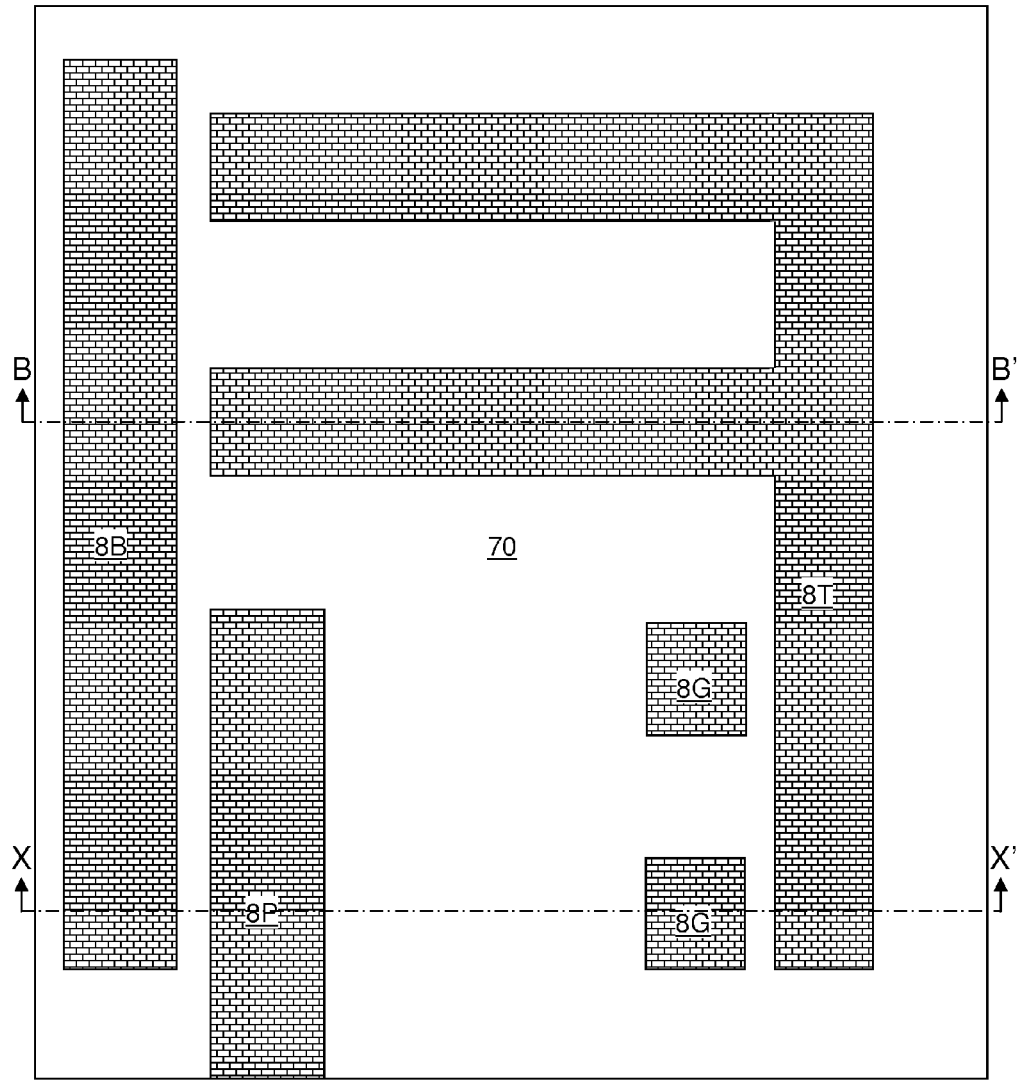
FIG. 9A is a top-down view of the first exemplary semiconductor structure of FIG. 9. The vertical plane X-X' is the plane of the vertical cross-sectional view of FIG. 9. The vertical plane B-B' is the plane of the vertical cross-sectional view of FIG. 9B.
Figure 9B:
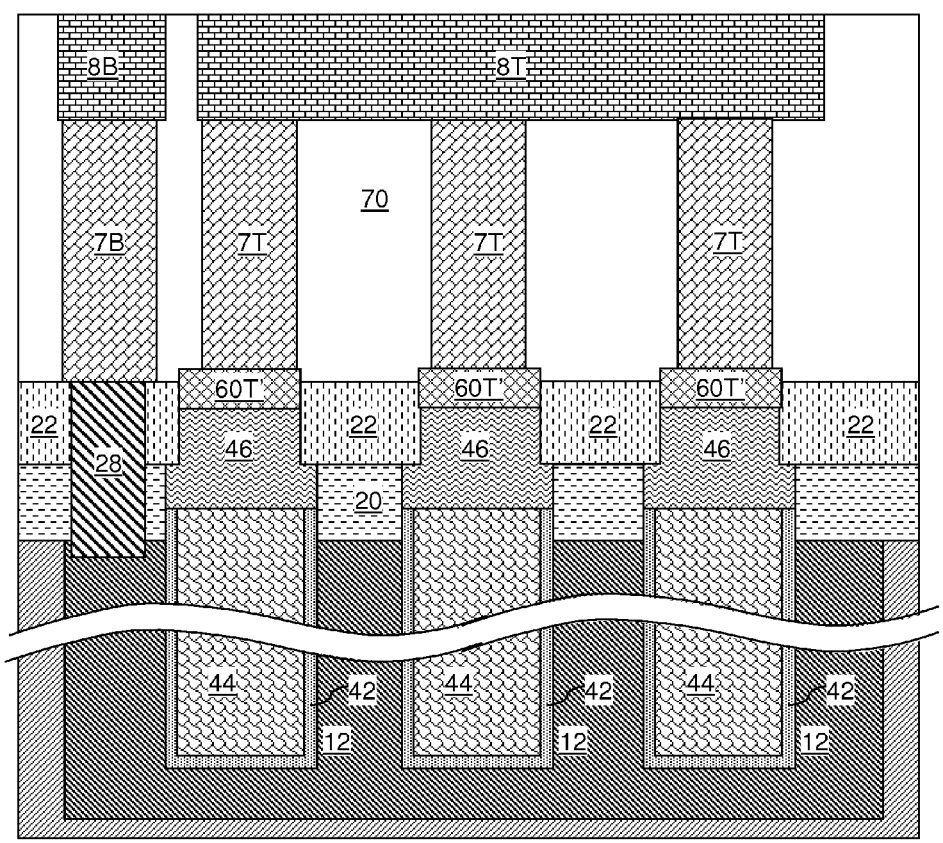
FIG. 9B is a vertical cross-sectional view of the first exemplary semiconductor structure of FIG. 9A along the vertical plane B-B'.

Referring to FIGS. 9, 9A, and 9B, at least one buried contact structure 28 is formed through the buried insulator layer 20 and the shallow trench isolation structure 22 to provide electrical contact to the buried plate 12. A contact level dielectric layer 70 and various metal interconnect structures (7B, 7T, 7P, 7G, 7D, 8B, 8T, 8P, 8G) can be formed in the contact level dielectric layer 70. The metal interconnect structures (7B, 7T, 7P, 7G, 7D, 8B, 8T, 8P, 8G) include outer electrode contact via structures 7B and outer electrode node line structures 8B that are electrically shorted to the buried plate 12, and inner electrode contact via structures 7T and inner electrode node line structures 8T that are electrically shorted to the inner electrodes 44 of the trench capacitors (12, 42, 44) within the array of trench capacitors (12, 42, 44).

The metal interconnect structures (7B, 7T, 7P, 7G, 7D, 8B, 8T, 8P, 8G) include drain contact via structures 7D, each of which contacts a drain-side metal semiconductor alloy portion 60D, and an inner electrode node line structures 8T. Further, the metal interconnect structures (7B, 7T, 7P, 7G, 7D, 8B, 8T, 8P, 8G) include gate contact via structures 7G and the gate line structures 8G that are electrically shorted to gate electrodes 52 of the field effect transistors. In addition, the metal interconnect structures (7B, 7T, 7P, 7G, 7D, 8B, 8T, 8P, 8G) include programming contact via structures 7P and programming node line structures 8P that are electrically shorted to the trench top metal semiconductor alloy portions 60T overlying discrete trench capacitors (12, 42, 44).

One end of each programmable electrical switching device is electrically shorted to an inner electrode 44 of a discrete trench capacitor (12, 42, 44), and another end of each programmable electrical switching device is electrically shorted to inner electrodes 44 of a plurality of trench capacitors (12, 42, 44) in the array environment through a subset of the metal interconnect structures (7D, 7T, 8T) to provide a first node of a capacitor structure. As used herein, a "capacitor structure" refers to a structure that includes at least one capacitor and configured to provide two end nodes that function as two opposing capacitor nodes.

The first node of the capacitor structure can be electrically shorted to each drain region 3D of at least one field effect transistor only through a set of metal interconnect structures (7D, 7T, 8T). A pad portion (30C, 60I) of each electrically programmable fuse is electrically shorted to the inner electrode 44 of a discrete trench capacitor (12, 42, 44). Each outer electrode of the discrete trench capacitors and a plurality of trench capacitors in the array environment can be implemented as the buried plate 12, and thus, are electrically shorted among one another to provide a second node of the capacitor structure.

Each programmable electrical switching device can be programmed permanently or temporarily to electrically disconnect the inner electrode 44 of a discrete trench capacitor from the first node of the capacitor structure. In one embodiment, the field effect transistors can function as programming transistors while a voltage bias is applied across a pair of a drain contact via structures 7D and a programming contact via structure 7P to program an electrically programmable fuse structure through electromigration of the metal semiconductor alloy material in the metal semiconductor alloy link portion 60F. The selection of the electrically programmable fuse structures to be programmed can be performed so that the total capacitance of the capacitor structure, when all the field effect transistors within the programmable electrical switching devices are turned on, has a target capacitance value. Once the programming of the electrically programmable fuse structures is complete, the capacitor structure can be operated with all of the field effect transistors turned on. When the field effect transistors are turned on, the capacitance of each discrete trench capacitor is added to the capacitance of the capacitor structure if the corresponding programmable electrical fuse structure is not programmed, and is not added to the capacitance of the capacitor structure if the corresponding programmable electrical fuse structure is programmed.

Figure 10:
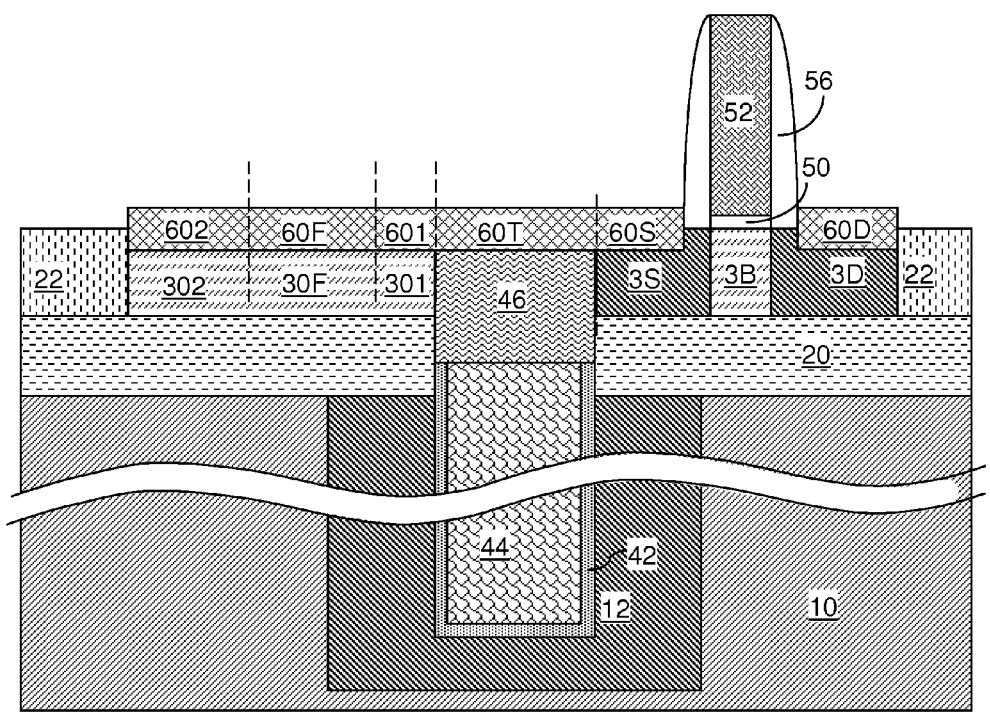
FIG. 10 is a vertical cross-sectional view of a second exemplary semiconductor structure after formation of metal semiconductor alloy regions according to a second embodiment of the present disclosure.
Figure 10A:
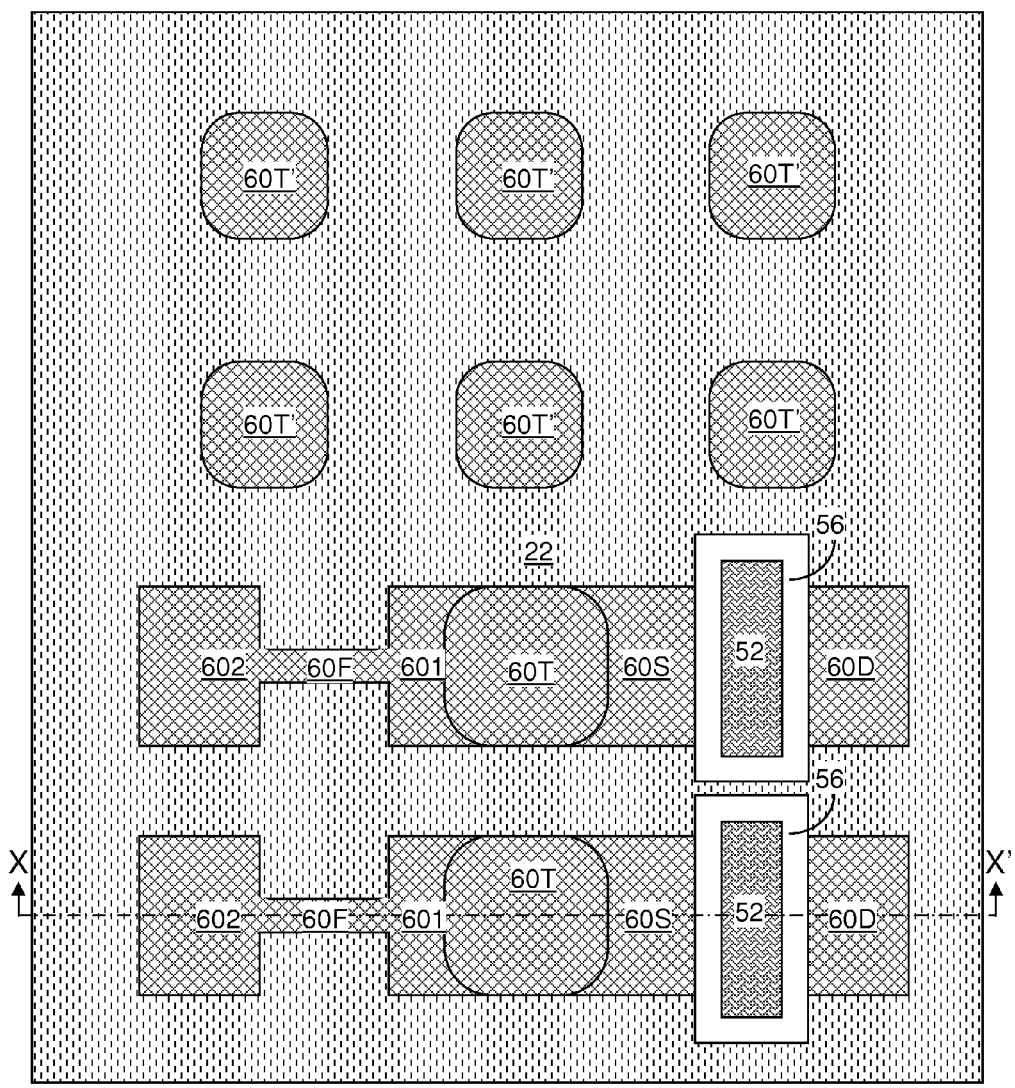
FIG. 10A is a top-down view of the second exemplary semiconductor structure of FIG. 10.

Referring to FIGS. 10 and 10A, a second exemplary semiconductor structure can be derived from the first exemplary semiconductor structure by modifying the pattern of the remaining portions of the top semiconductor layer 30L after the etch process at the processing steps of FIG. 5, and performing the processing steps of FIGS. 6, 6A, and 6B.

Two semiconductor material portions are formed on the sidewalls of a conductive strap structure 46 overlying the inner electrode 44 of a discrete trench capacitor (12, 42, 44). A first semiconductor material portion includes a first pad semiconductor portion 301 contacting the conductive strap structure 46, a semiconductor fuselink portion 30F laterally contacting the first pad semiconductor portion 301, and a second semiconductor pad portion 302 laterally contacting the semiconductor fuselink portion 30F. The semiconductor fuselink portion 30F has a uniform width, which is lesser than the width of the first pad semiconductor portion 301 and the width of the second pad semiconductor portion 302. A second semiconductor material portion laterally contacts the conductive strap structure 46. In one embodiment, the second semiconductor material portion can be spaced from the first semiconductor material portion (301, 30F, 302) by the conductive strap structure 46.

The processing steps of FIG. 7 can be performed to form at least one field effect transistor. Each field effect transistor can be formed in a second semiconductor material portion, which includes a source region 3S, a drain region 3D, and a body region 3B after formation of the at least one field effect transistor.

The processing steps of FIGS. 8 and 8A are performed to form various metal semiconductor alloy regions. Specifically, various metal semiconductor alloy regions (60T, 601, 60F, 602, 60S, 60D) can be formed on physically exposed semiconductor surfaces by depositing a metallic material layer, inducing formation of a metal semiconductor alloy by an anneal, and by removing unreacted portions of the metallic material layer selective to the metal semiconductor alloy. The metal semiconductor alloy regions (60T, 601, 60F, 602, 60S, 60D) can include at least one contiguous metal semiconductor alloy structure (60T, 601, 60F, 602, 60S). Each contiguous metal semiconductor alloy structure (60T, 601, 60F, 602, 60S) can include a trench top metal semiconductor alloy portion 60T overlying an inner electrode 44 of a trench capacitor (12, 42, 44), a first pad metal semiconductor alloy portion 601 contacting a top surface of a first pad semiconductor portion 301, a metal semiconductor alloy link portion 60F formed on the semiconductor fuselink portion 30F and between the first pad metal semiconductor alloy portion 601 and a second pad metal semiconductor alloy portion 602, the second pad metal semiconductor alloy portion 602 overlying a second pad semiconductor portion 302, and a source-side metal semiconductor alloy portion 60S contacting, and overlying, a source region 3S of a field effect transistor. At least one portion of the contiguous metal semiconductor alloy structure (60T, 601, 60F, 602, 60S) can be a component of a programmable electrical switching device. A drain-side metal semiconductor alloy portion 60D can be formed over each drain region 3D. Additional trench top metal semiconductor alloy portions 60T can be formed on the conductive cap structures 46 overlying inner electrodes 44 of trench capacitors (12, 42, 44) in the array environment.

Each combination of a first pad semiconductor portion 301, a semiconductor fuselink portion 30F, a second pad semiconductor portion 302, a first pad metal semiconductor alloy portion 601, a metal semiconductor alloy link portion 60F, and a second pad metal semiconductor alloy portion 602 constitutes an electrically programmable fuse structure. Each electrically programmable fuse structure constitutes a programmable electrical switching device. The programmable electrical switching device can be in an electrically conducting state when the electrically programmable fuse structure is not programmed (not electromigrated), or can be in an electrically disconnected state when the electrically programmable fuse structure is programmed (electromigrated). An inner electrode 44 of each discrete trench capacitor (12, 42, 44) is electrically shorted to one end node of the programmable electrical switching device.

The second exemplary semiconductor structure includes a series connection of an electrically programmable fuse structure located on a semiconductor substrate and a field effect transistor located on the semiconductor substrate. At least one discrete trench capacitor (12, 42, 44) is located in the semiconductor substrate. The inner electrode 44 of the trench capacitor (12, 42, 44) is electrically shorted to an end node of the series connection.

Each field effect transistor connected to an electrically programmable fuse structure through a conductive strap structure 46 and an overlying trench top metal semiconductor alloy portion 60T is a programming transistor that can be employed to program the electrically programmable fuse structure. The metal semiconductor alloy link portion 60F is formed between a first end of the programmable electrical switching device and the second end of the programmable electrical switching device. Each trench top metal semiconductor alloy portion 60T overlying the inner electrode 44 of a discrete trench capacitor (12, 42, 44) can be electrically shorted to a source region 3S of the programming transistor.

Figure 11:
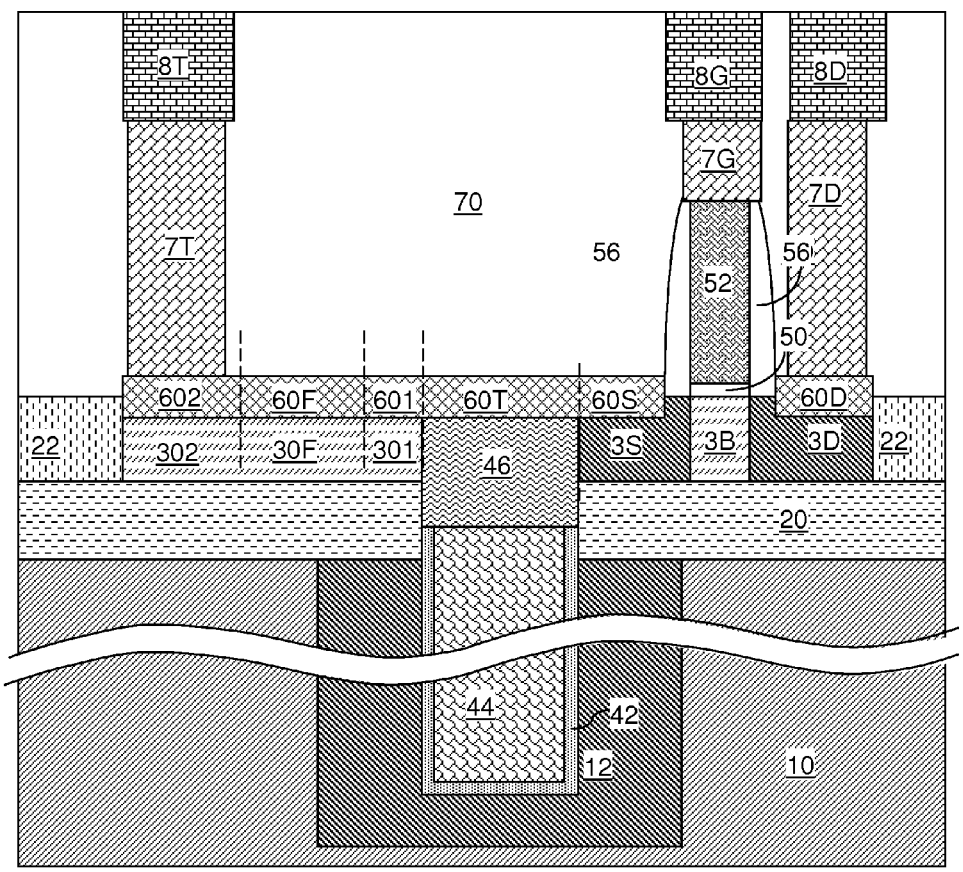
FIG. 11 is a vertical cross-sectional view of the second exemplary semiconductor structure after formation of a contact level dielectric layer and metal interconnect structures according to the second embodiment of the present disclosure.
Figure 11A:
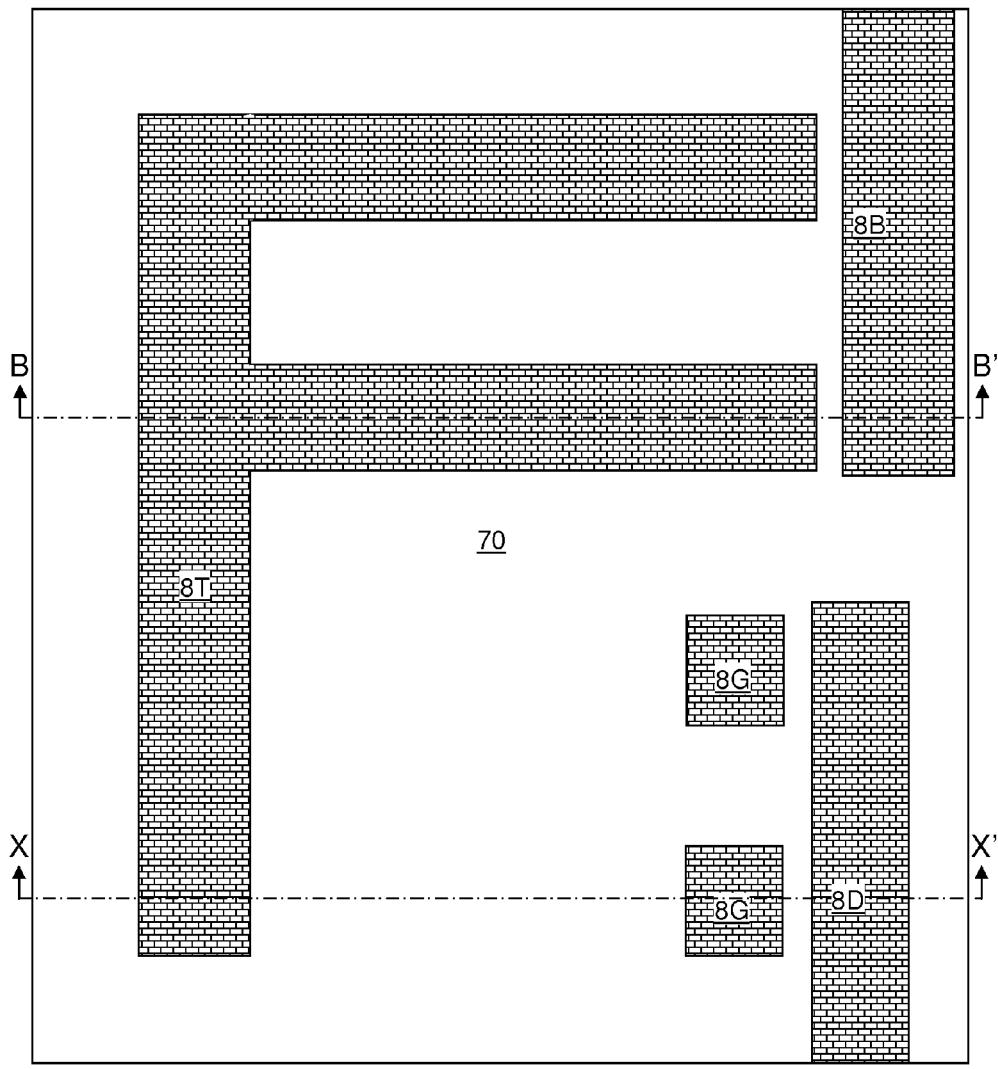
FIG. 11A is a top-down view of the second exemplary semiconductor structure of FIG. 11. The vertical plane X-X' is the plane of the vertical cross-sectional view of FIG. 11. The vertical plane B-B' is the plane of the vertical cross-sectional view of FIG. 11B.
Figure 11B:
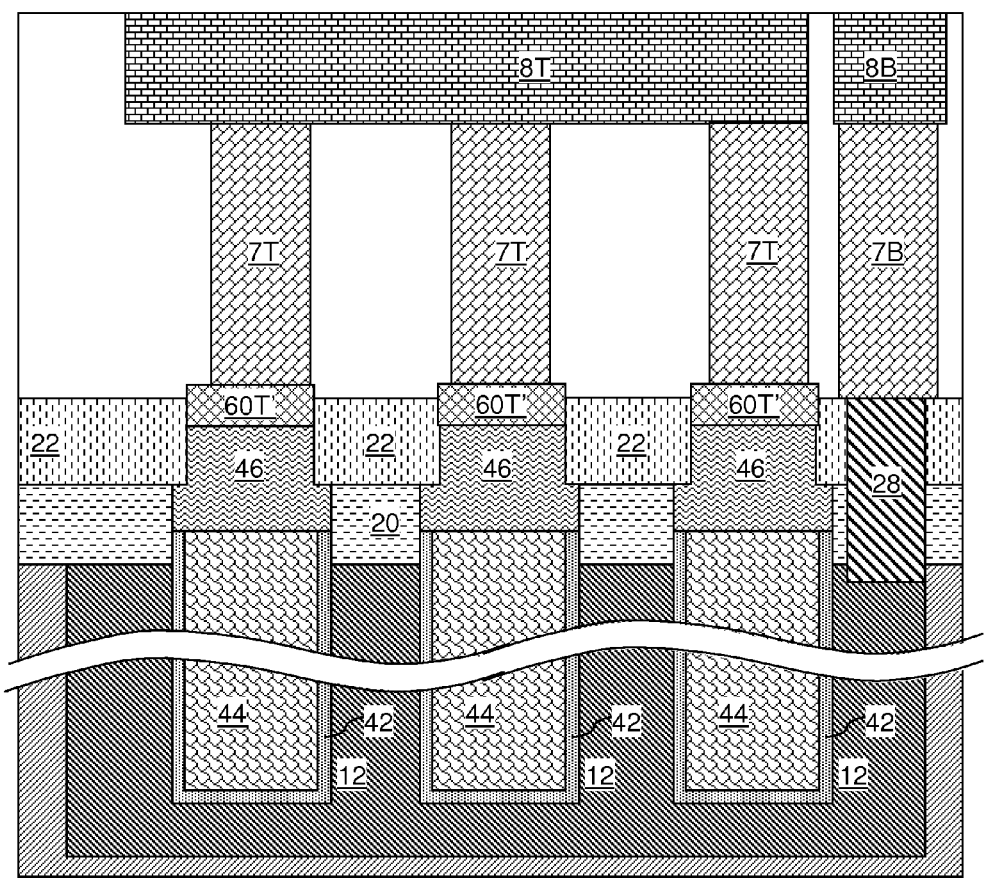
FIG. 11B is a vertical cross-sectional view of the second exemplary semiconductor structure of FIG. 11A along the vertical plane B-B'.

Referring to FIGS. 11, 11A, and 11B, at least one buried contact structure 28 is formed through the buried insulator layer 20 and the shallow trench isolation structure 22 to provide electrical contact to the buried plate 12. A contact level dielectric layer 70 and various metal interconnect structures (7B, 7T, 7G, 7D, 8B, 8T, 8G, 8D) can be formed in the contact level dielectric layer 70. The metal interconnect structures (7B, 7T, 7G, 7D, 8B, 8T, 8G, 8D) include outer electrode contact via structures 7B and outer electrode node line structures 8B that are electrically shorted to the buried plate 12, and inner electrode contact via structures 7T and inner electrode node line structures 8T that are electrically shorted to the inner electrodes 44 of the trench capacitors (12, 42, 44) within the array of trench capacitors (12, 42, 44).

The metal interconnect structures (7B, 7T, 7G, 7D, 8B, 8T, 8G, 8D) include drain contact via structures 7D, each of which contacts a drain-side metal semiconductor alloy portion 60D, and a drain line structures 8D. Further, the metal interconnect structures (7B, 7T, 7P, 7G, 7D, 8B, 8T, 8P, 8G, 8D) include gate contact via structures 7G and the gate line structures 8G that are electrically shorted to gate electrodes 52 of the field effect transistors.

In the second embodiment, each programmable electrical fuse structure is a programmable electrical switching device, and is connected to a field effect transistor that functions as a programming transistor. One end of each programmable electrical switching device is electrically shorted to an inner electrode 44 of a discrete trench capacitor (12, 42, 44), and another end of each programmable electrical switching device is electrically shorted to inner electrodes 44 of a plurality of trench capacitors (12, 42, 44) in the array environment through a subset of the metal interconnect structures (7D, 7T, 8T) to provide a first node of a capacitor structure.

The first node of the capacitor structure can be electrically shorted to each drain region 3D of at least one field effect transistor only through a set of metal interconnect structures (7D, 7T, 8T). A first pad portion (301, 601) of each electrically programmable fuse is electrically shorted to the inner electrode 44 of a discrete trench capacitor (12, 42, 44). Each outer electrode of the discrete trench capacitors and a plurality of trench capacitors in the array environment can be implemented as the buried plate 12, and thus, are electrically shorted among one another to provide a second node of the capacitor structure.

The first pad portion (301, 601) is electrically shorted to the inner electrode 44 of a discrete trench capacitor (12, 42, 44). The first node of the capacitor structure is electrically shorted to a second pad portion (302, 602) of the electrically programmable fuse. Each inner electrode of at least trench capacitor (12, 42, 44) is electrically shorted to the first node of the capacitor structure. In one embodiment, the at least one trench capacitor (12, 42, 44) can be a plurality of trench capacitors (12, 42, 44) in the array environment.

In one embodiment, each programming transistor can be electrically shorted to the first pad portion (301, 601) of the electrically programmable fuse structure. A drain region 3D of the programming transistor can be electrically shorted to a power supply node, and can be electrically isolated from the inner electrode 44 of the discrete trench capacitor (12, 42, 44) when the programming transistor is turned off.

Each programmable electrical switching device can be programmed permanently or temporarily to electrically disconnect the inner electrode 44 of a discrete trench capacitor from the first node of the capacitor structure. In one embodiment, the field effect transistors can function as programming transistors while a voltage bias is applied across a pair of a drain contact via structures 7D and a second pad portion (302, 602) to program an electrically programmable fuse structure through electromigration of the metal semiconductor alloy material in the metal semiconductor alloy link portion 60F. The selection of the electrically programmable fuse structures to be programmed can be performed so that the total capacitance of the capacitor structure, when all the field effect transistors within the programmable electrical switching devices are turned on, has a target capacitance value. Once the programming of the electrically programmable fuse structures is complete, the capacitor structure can be operated with all of the field effect transistors turned on. Prior to programming, the capacitance of each discrete trench capacitor is added to the capacitance of the plurality of trench capacitors in the array environment within the capacitor structure. Once the programming of the electrically programmable fuse structures is complete, the capacitance of each discrete trench capacitor is added to the capacitance of the capacitor structure if the corresponding programmable electrical fuse structure is not programmed, and is not added to the capacitance of the capacitor structure if the corresponding programmable electrical fuse structure is programmed.

Figure 12:
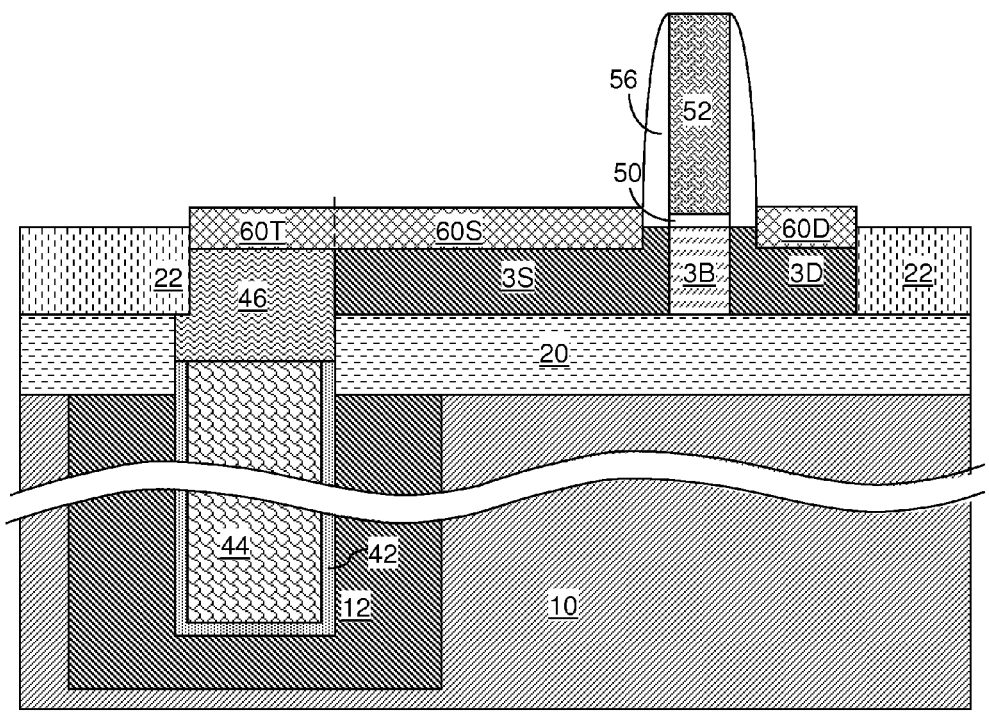
FIG. 12 is a vertical cross-sectional view of a third exemplary semiconductor structure after formation of metal semiconductor alloy regions according to a third embodiment of the present disclosure.
Figure 12A:
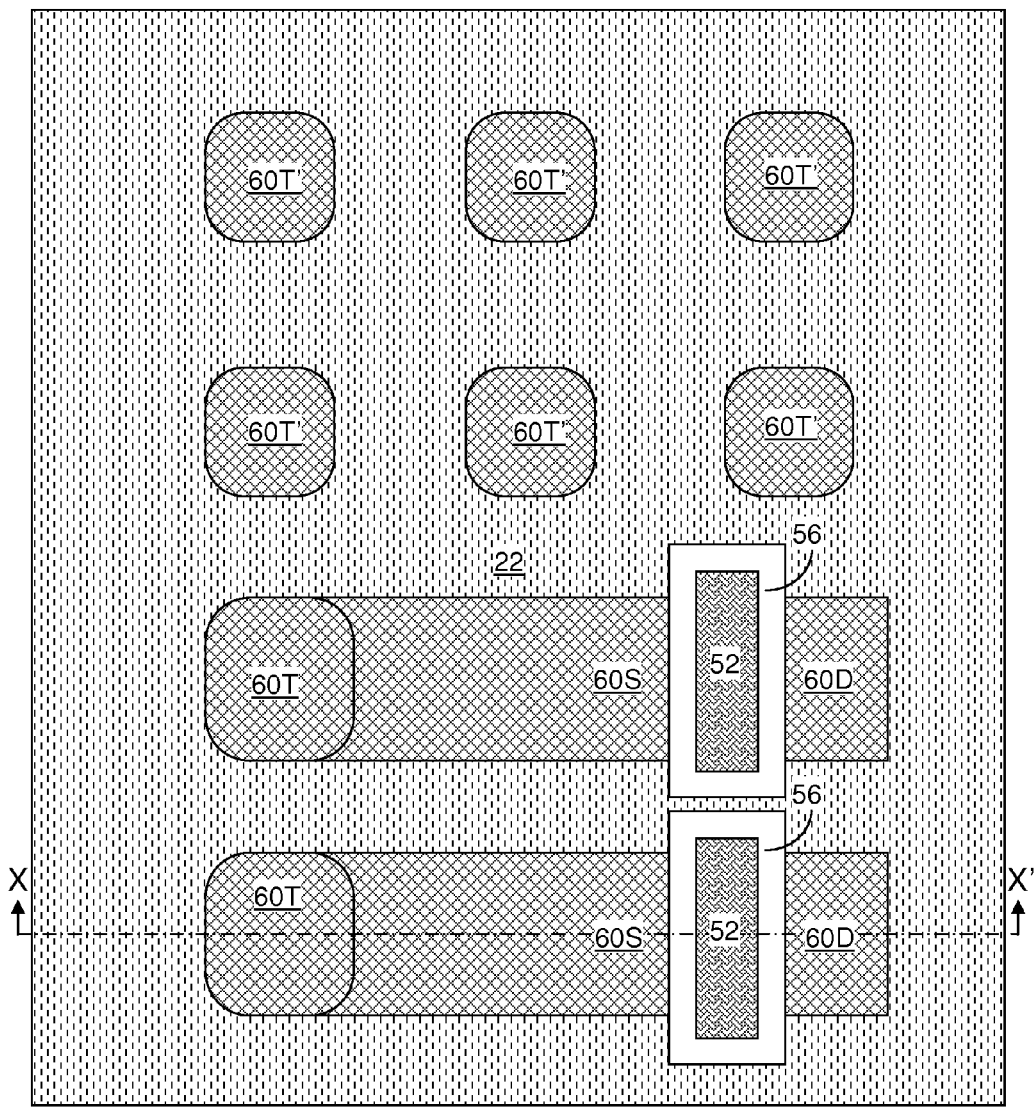
FIG. 12A is a top-down view of the third exemplary semiconductor structure of FIG. 10.

Referring to FIGS. 12 and 12A, a third exemplary semiconductor structure can be derived from the first or second exemplary semiconductor structure by omitting the formation of at least one electrically programmable fuse structure. Each field effect transistor functions as a programmable electrical switching device, which is temporarily programmable, i.e., programmable through turning on or turning off the corresponding field effect transistor. Each contiguous metal semiconductor alloy structure (60T, 60S) contains a trench top metal semiconductor alloy portion 60T overlying the inner electrode 44 of a discrete trench capacitor (12, 42, 44), and a source-side metal semiconductor alloy portion 60S contacting a source region 3S of the field effect transistor.

Figure 13:
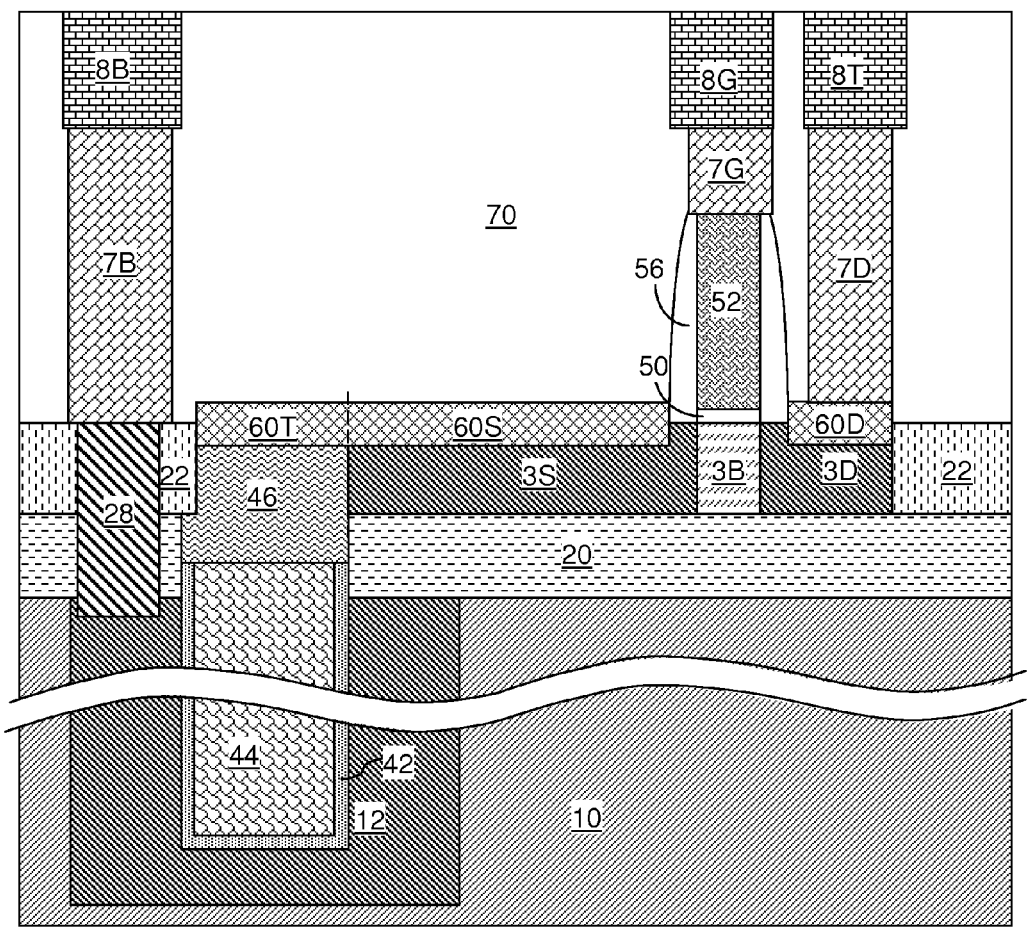
FIG. 13 is a vertical cross-sectional view of the third exemplary semiconductor structure after formation of a contact level dielectric layer and metal interconnect structures according to the third embodiment of the present disclosure.
Figure 13A:
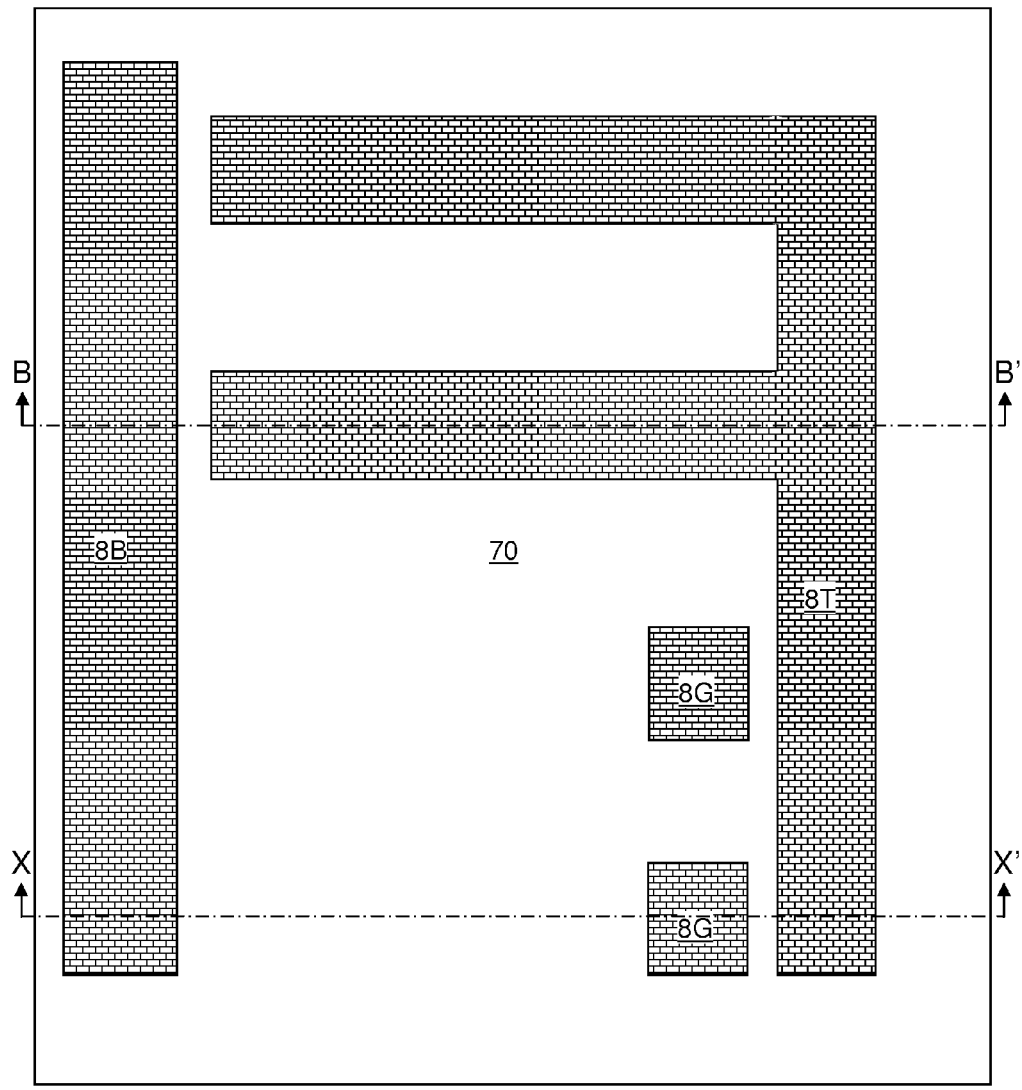
FIG. 13A is a top-down view of the third exemplary semiconductor structure of FIG. 13. The vertical plane X-X' is the plane of the vertical cross-sectional view of FIG. 13. The vertical plane B-B' is the plane of the vertical cross-sectional view of FIG. 13B.
Figure 13B:
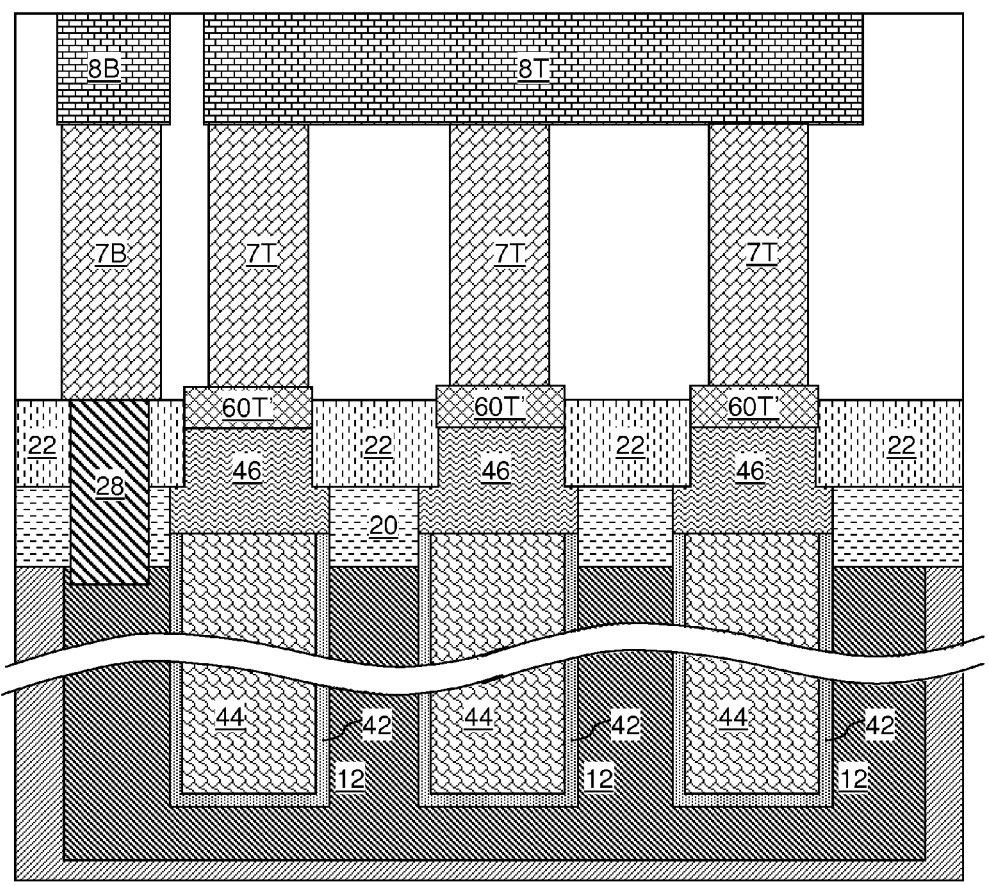
FIG. 13B is a vertical cross-sectional view of the third exemplary semiconductor structure of FIG. 13A along the vertical plane B-B'.

Referring to FIGS. 13, 13A, and 13B, at least one buried contact structure 28 is formed through the buried insulator layer 20 and the shallow trench isolation structure 22 to provide electrical contact to the buried plate 12. A contact level dielectric layer 70 and various metal interconnect structures (7B, 7T, 7G, 7D, 8B, 8T, 8G) can be formed in the contact level dielectric layer 70. The metal interconnect structures (7B, 7T, 7G, 7D, 8B, 8T, 8G) include outer electrode contact via structures 7B and outer electrode node line structures 8B that are electrically shorted to the buried plate 12, and inner electrode contact via structures 7T and inner electrode node line structures 8T that are electrically shorted to the inner electrodes 44 of the trench capacitors (12, 42, 44) within the array of trench capacitors (12, 42, 44).

The metal interconnect structures (7B, 7T, 7G, 7D, 8B, 8T, 8G) include drain contact via structures 7D, each of which contacts a drain-side metal semiconductor alloy portion 60D and an inner electrode node line structures 8T. Further, the metal interconnect structures (7B, 7T, 7P, 7G, 7D, 8B, 8T, 8P, 8G) include gate contact via structures 7G and the gate line structures 8G that are electrically shorted to gate electrodes 52 of the field effect transistors.

In the third embodiment, each field effect transistor is a programmable electrical switching device. One end of each programmable electrical switching device is electrically shorted to an inner electrode 44 of a discrete trench capacitor (12, 42, 44), and another end of each programmable electrical switching device is electrically shorted to inner electrodes 44 of a plurality of trench capacitors (12, 42, 44) in the array environment through a subset of the metal interconnect structures (7D, 7T, 8T) to provide a first node of a capacitor structure.

The first node of the capacitor structure can be electrically shorted to each drain region 3D of at least one field effect transistor only through a set of metal interconnect structures (7D, 7T, 8T). The source region 3S of each field effect transistor is electrically shorted to the inner electrode 44 of a discrete trench capacitor (12, 42, 44). Each outer electrode of the discrete trench capacitors and a plurality of trench capacitors in the array environment can be implemented as the buried plate 12, and thus, are electrically shorted among one another to provide a second node of the capacitor structure.

In the third embodiment, each field effect transistor functions as a programmable electrical switching device, which programs the electrical connection or the electrical disconnection of the discrete trench capacitors (12, 42, 44) from the plurality of trench capacitors (12, 42, 44) in the array. The third exemplary semiconductor structure includes at least one series connection of an inner electrode 44 of a discrete trench capacitor (12, 42, 44) located in a semiconductor substrate and a programmable electrical switching device located on the semiconductor substrate. Each programmable electrical switching device includes a field effect transistor including a drain region 3D that is electrically shorted to a first node of the capacitor structure. At least another trench capacitor (12, 42, 44) is located in the semiconductor substrate. Each inner electrode 44 of the at least another trench capacitor (12, 42, 44) is electrically shorted to the first node of the capacitor structure. In one embodiment, the at least another trench capacitor (12, 42, 44) can be a plurality of trench capacitors (12, 42, 44) in an array environment.

Each programmable electrical switching device can be programmed temporarily and reversibly to electrically disconnect the inner electrode 44 of a discrete trench capacitor from the first node of the capacitor structure. The selection of the field effect transistors to be turned on or turned off can be performed so that the total capacitance of the capacitor structure has a target capacitance value.

While the disclosure has been described in terms of specific embodiments, it is evident in view of the foregoing description that numerous alternatives, modifications and variations will be apparent to those skilled in the art. Each of the embodiments described herein can be implemented individually or in combination with any other embodiment unless expressly stated otherwise or clearly incompatible. Accordingly, the disclosure is intended to encompass all such alternatives, modifications and variations which fall within the scope and spirit of the disclosure and the following claims.

What is claimed is:

1. A capacitor structure comprising:
   a set of serially connected devices including an inner electrode of a trench capacitor located in a semiconductor substrate and a programmable electrical switching device located on said semiconductor substrate, wherein said programmable electrical switching device is electrically shorted to a first node of said capacitor structure; and
   at least another trench capacitor located in said semiconductor substrate, wherein an inner electrode of each of said at least another trench capacitor is electrically shorted to said first node of said capacitor structure,
   wherein an outer electrode of said trench capacitor and an outer electrode of each of said at least another trench capacitor are electrically shorted to a second node of said capacitor structure.

2. The capacitor structure of claim 1, wherein said programmable electrical switching device comprises a field effect transistor, and said capacitor structure further comprises a contiguous metal semiconductor alloy structure that contain at least:
  a trench top metal semiconductor alloy portion overlying said inner electrode of said trench capacitor; and
  a source-side metal semiconductor alloy portion contacting a source region of said field effect transistor.

3. The capacitor structure of claim 1, wherein said programmable electrical switching device comprises a field effect transistor, and said first node of said capacitor structure is electrically shorted to a drain region of said field effect transistor only through a set of metal interconnect structures.

4. The capacitor structure of claim 1, wherein said programmable electrical switching device comprises a series connection of an electrically programmable fuse structure and a field effect transistor, wherein said electrically programmable fuse is electrically shorted to said inner electrode of said trench capacitor, and a drain region of said field effect transistor is electrically shorted to said first node of said capacitor structure.

5. The capacitor structure of claim 1, wherein said programmable electrical switching device comprises an electrically programmable fuse structure having a pad portion that is electrically shorted to said inner electrode of said trench capacitor.

6. The capacitor structure of claim 5, wherein said programmable electrical switching device further comprises a field effect transistor, and said first node of said capacitor structure is electrically shorted to a drain region of said field effect transistor only through a set of metal interconnect structures.

7. The capacitor structure of claim 5, further comprising a programming transistor electrically shorted to another pad portion of said electrically programmable fuse structure, wherein a drain region of said programming transistor is electrically shorted to a power supply node, and is electrically isolated from said inner electrode of said trench capacitor when said programming transistor is turned off.

8. The capacitor structure of claim 7, wherein a source region of said programming transistor is electrically shorted to said inner electrode of said trench capacitor.

9. A capacitor structure comprising:
  a set of serially connected devices including an electrically programmable fuse structure located on a semiconductor substrate and a field effect transistor located on said semiconductor substrate; and
  a trench capacitor located in said semiconductor substrate, wherein an inner electrode of said trench capacitor is electrically shorted to a node in said series connection.

10. The capacitor structure of claim 9, further comprising a contiguous metal semiconductor alloy structure that contains at least:
  a trench top metal semiconductor alloy portion overlying said inner electrode of said inner electrode; and
  a source-side metal semiconductor alloy portion contacting a source region of said field effect transistor.

11. The capacitor structure of claim 9, wherein a first node of said capacitor structure is electrically shorted to a drain region of said field effect transistor only through a set of metal interconnect structures.

12. The capacitor structure of claim 9, wherein a first pad portion of said electrically programmable fuse is electrically shorted to said inner electrode of said trench capacitor, and a first node of said capacitor structure is electrically shorted to a second pad portion of said electrically programmable fuse.

13. The capacitor structure of claim 12, wherein a source region of said field effect transistor is electrically shorted to said inner electrode of said trench capacitor, and a drain region of said field effect transistor is electrically shorted to a power supply node.

14. A method of forming a capacitor structure, said method comprising:
  forming a first trench capacitor and a plurality of second trench capacitors within a semiconductor substrate;
  forming a programmable electrical switching device on said semiconductor substrate, wherein an inner electrode of said first trench capacitor is electrically shorted to one end node of said programmable electrical switching device;
  forming metal interconnect structures on said substrate, wherein another end of said programmable electrical switching device is electrically shorted to inner electrodes of said plurality of second trench capacitors through a subset of said metal interconnect structures to provide a first node of a capacitor structure.

15. The method of claim 14, wherein an outer electrode of said first trench capacitor and outer electrodes of said plurality of second trench capacitors are electrically shorted among one another to provide a second node of said capacitor structure.

16. The method of claim 14, further comprising forming a contiguous metal semiconductor alloy structure on said inner electrode of said first trench capacitor, wherein at least one portion of said contiguous metal semiconductor alloy structure is a component of said programmable electrical switching device.

17. The method of claim 16, wherein said programmable electrical switching device comprises a series connection of an electrically programmable fuse structure and a field effect transistor, and said contiguous metal semiconductor alloy structure contains at least:
  a trench top metal semiconductor alloy portion overlying said inner electrode of said first trench capacitor;
  a source-side metal semiconductor alloy portion contacting a source region of said field effect transistor; and
  a metal semiconductor alloy link portion formed between said trench top metal semiconductor alloy portion and said source-side metal semiconductor alloy portion.

18. The method of claim 16, wherein said programmable electrical switching device comprises an electrically programmable fuse structure, and said method further comprises forming a programming transistor, wherein said contiguous metal semiconductor alloy structure includes:
  a metal semiconductor alloy link portion formed between said end of said programmable electrical switching device and said another end of said programmable electrical switching device; and
  a trench top metal semiconductor alloy portion overlying said inner electrode of said first trench capacitor and electrically shorted to a source region of said programming transistor.

19. The method of claim 16, wherein said programmable electrical switching device comprises a field effect transistor, and said contiguous metal semiconductor alloy structure contains at least:
  a trench top metal semiconductor alloy portion overlying said inner electrode of said first trench capacitor; and
  a source-side metal semiconductor alloy portion contacting a source region of said field effect transistor.

20. The method of claim 14, further comprising programming, permanently or temporarily, said programmable electrical switching device to electrically disconnect said inner electrode of said first trench capacitor from said first node of said capacitor structure.

* * * * *